(12) United States Patent
Som et al.

(10) Patent No.: US 11,929,408 B2
(45) Date of Patent: Mar. 12, 2024

(54) LAYOUT TECHNIQUES AND OPTIMIZATION FOR POWER TRANSISTORS

(71) Applicant: MACOM Technology Solutions Holdings, Inc., Lowell, MA (US)

(72) Inventors: Shamit Som, Chelmsford, MA (US); Wayne Mack Struble, Franklin, MA (US); Jason Matthew Barrett, Amherst, NH (US); Nishant R Yamujala, Somerville, MA (US); John Stephen Atherton, Acton, MA (US)

(73) Assignee: MACOM TECHNOLOGY SOLUTIONS HOLDINGS, INC., Lowell, MA (US)

( * ) Notice: Subject to any disclaimer, the term of this patent is extended or adjusted under 35 U.S.C. 154(b) by 297 days.

(21) Appl. No.: 16/874,098

(22) Filed: May 14, 2020

(65) Prior Publication Data
US 2021/0359092 A1    Nov. 18, 2021

(51) Int. Cl.
| | | |
|---|---|---|
| *H01L 29/778* | (2006.01) | |
| *H01L 29/20* | (2006.01) | |
| *H01L 29/40* | (2006.01) | |
| *H01L 29/417* | (2006.01) | |
| *H01L 29/423* | (2006.01) | |

(52) U.S. Cl.
CPC .... *H01L 29/41758* (2013.01); *H01L 29/2003* (2013.01); *H01L 29/402* (2013.01); *H01L 29/42316* (2013.01); *H01L 29/7786* (2013.01)

(58) Field of Classification Search
CPC ............ H01L 23/4822; H01L 23/4824; H01L 29/4238; H01L 23/66; H01L 23/481; H01L 23/4821; H01L 29/41758; H01L 29/0696; H01L 2224/48227; H01L 2224/49175
See application file for complete search history.

(56) References Cited

U.S. PATENT DOCUMENTS

| | | | | |
|---|---|---|---|---|
| 4,104,672 A | * | 8/1978 | DiLorenzo | ............ H01L 29/812 257/280 |
| 5,057,882 A | * | 10/1991 | Pritchett | ................. H01L 29/78 257/737 |

(Continued)

FOREIGN PATENT DOCUMENTS

TW         202001575 A      1/2020

OTHER PUBLICATIONS

International Search Report and Written Opinion for PCT/US2020/042058 dated Mar. 16, 2021.

(Continued)

*Primary Examiner* — Eric A. Ward
(74) *Attorney, Agent, or Firm* — Perilla Knox & Hildebrandt LLP; Jason M. Perilla

(57) ABSTRACT

Various embodiments are disclosed for improved and structurally optimized transistors, such as RF power amplifier transistors. A transistor may include a drain metal portion raised from a surface of a substrate, a drain metal having a notched region, a gate manifold body with angled gate tabs extending from the gate manifold, and/or a source-connected shielding. The transistor may include a high-electron-mobility transistor (HEMT), a gallium nitride (GaN)-on-silicon transistor, a GaN-on-silicon-carbide transistor, or other type of transistor.

20 Claims, 20 Drawing Sheets

(56) References Cited

U.S. PATENT DOCUMENTS

| | | | |
|---|---|---|---|
| 6,559,513 B1* | 5/2003 | Miller | H01L 29/402 |
| | | | 257/280 |
| 8,816,397 B2 | 8/2014 | Darwish et al. | |
| 9,093,420 B2* | 7/2015 | Kobayashi | H01L 29/42316 |
| 9,812,534 B2* | 11/2017 | Zhang | H01L 29/66068 |
| 10,229,978 B2* | 3/2019 | Liao | H01L 23/3171 |
| 2007/0023897 A1* | 2/2007 | Nakajima | H03F 3/601 |
| | | | 257/E29.12 |
| 2012/0012858 A1* | 1/2012 | Inoue | H01L 29/42316 |
| | | | 257/E27.06 |
| 2013/0009218 A1 | 1/2013 | Chen et al. | |
| 2014/0252416 A1* | 9/2014 | Takagi | H01L 29/41758 |
| | | | 257/194 |
| 2016/0240471 A1* | 8/2016 | Klowak | H01L 23/53228 |
| 2016/0322487 A1 | 11/2016 | Nogami et al. | |
| 2017/0053909 A1* | 2/2017 | Laighton | H01L 29/41758 |
| 2020/0027872 A1 | 1/2020 | Boles et al. | |
| 2020/0235215 A1* | 7/2020 | Yamaguchi | H01L 23/4821 |

OTHER PUBLICATIONS

Office Action in Taiwan Patent Application No. 109126375, dated Feb. 15, 2023, with Machine Translation.

\* cited by examiner

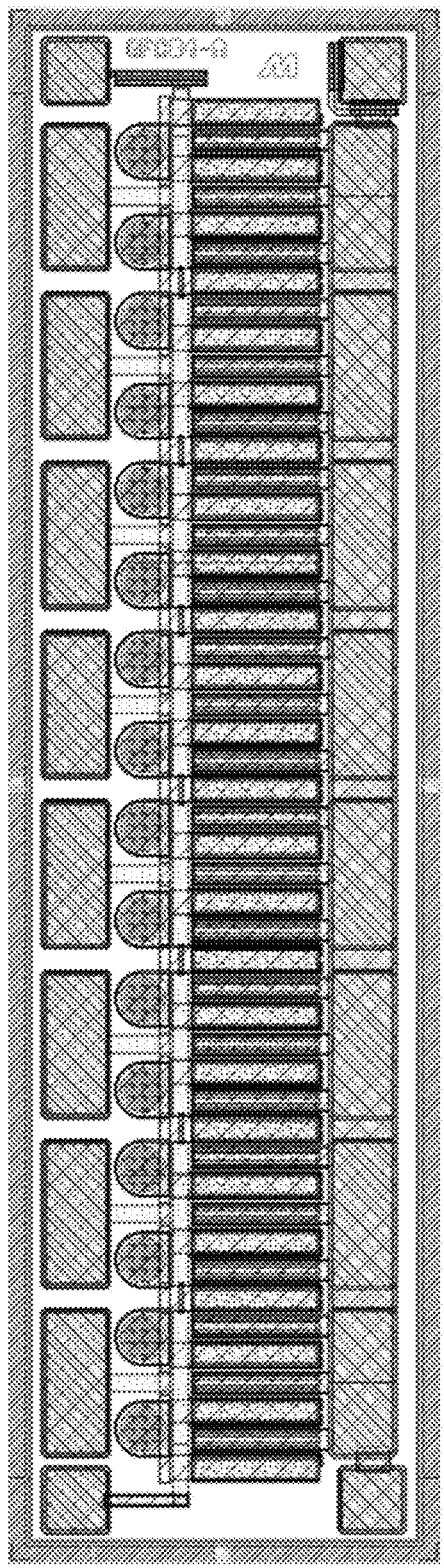
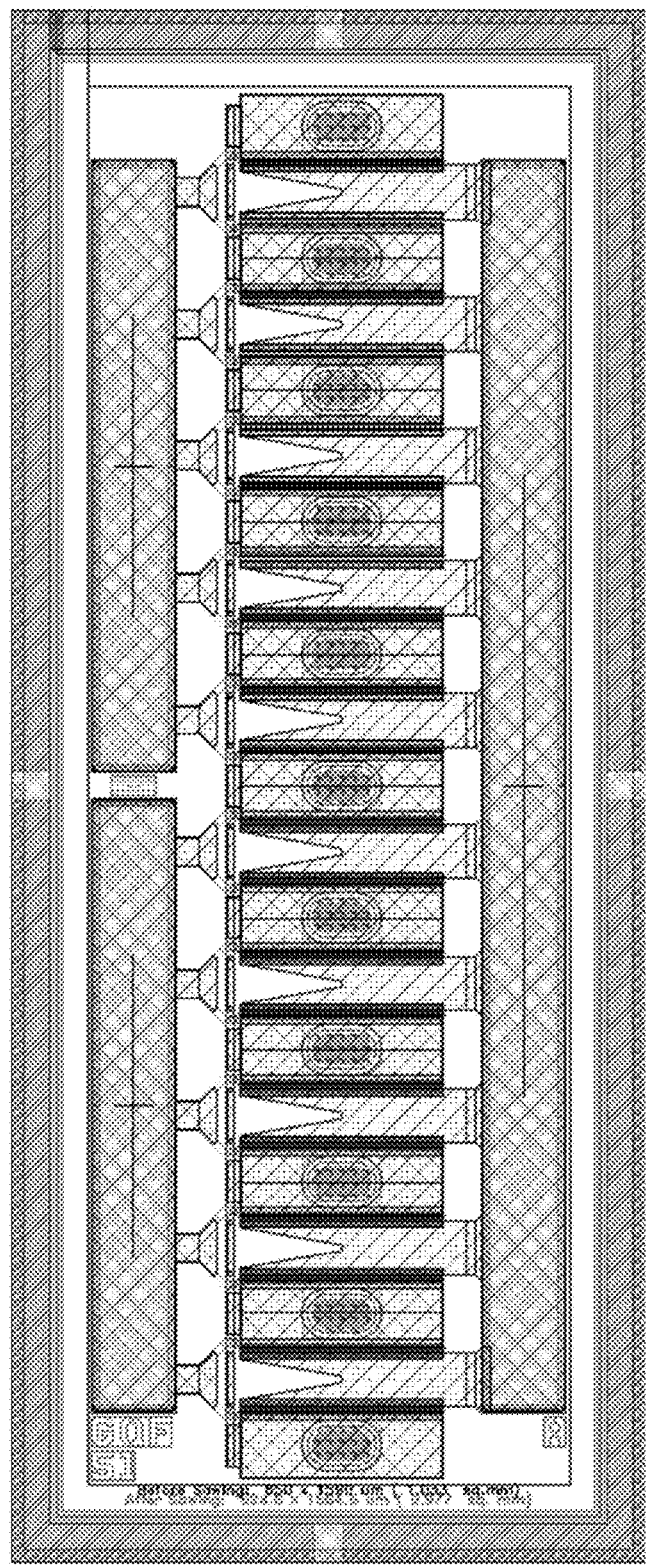
FIG. 21     FIG. 22

LAYOUT TECHNIQUES AND OPTIMIZATION FOR POWER TRANSISTORS

BACKGROUND

A multi-finger planar field-effect transistor (FET) layout consists of interdigitated contacts for gate, drain, and source metals. A parasitic output capacitance is formed between drain contacts and a substrate as well as between the drain contacts and a back-side ground plane of a die. These parasitic output capacitances can have a detrimental effect on the radio-frequency (RF) performance of the device, for instance, reducing device efficiency.

BRIEF SUMMARY OF THE INVENTION

Various embodiments are disclosed for improved and structurally optimized transistors, such as GaN-on-silicon power transistors as well as other transistors as will be described.

In a first aspect, a field effect transistor includes a drain metal portion raised from a surface of a substrate. The field effect transistor includes a substrate, a first source metal, a second source metal, and a drain metal positioned between the first source metal and the second source metal. The drain metal includes a first drain metal forming a first drain metal column and a second drain metal column and the field effect transistor comprises a second drain metal. The first drain metal column is positioned below the second drain metal on a first distal end of the second drain metal and the second drain metal column is positioned below the second drain metal on a second distal end of the second drain metal such that the second drain metal is raised from the substrate. An aperture is defined between the first drain metal column and the second drain metal column and below the second drain metal.

The field effect transistor may further include a first source metal and source-connected field plate (SFP), a second source metal and source-connected field plate (SFP), a first gate finger, and a second gate finger. The first source metal and SFP and the second source metal and SFP are each sized and positioned to include an overhang that defines an overhang aperture in which the gate fingers are positioned, respectively.

In a second aspect, a field effect transistor comprising a drain metal having a notched region. The field effect transistor includes a first source metal, a second source metal, and a drain metal positioned between the first source metal and the second source metal. The drain metal includes a drain metal body having a notched region defining a first projecting portion and a second projecting portion of the drain metal body. The first projecting portion and the second projecting portion of the drain metal body are positioned on respective sides of the notched region. The notched region is a triangular-shaped or a U-shaped notched region in various examples.

In a third aspect, a field effect transistor includes a gate manifold body with angled gate tabs extending from the gate manifold. The field effect transistor includes a source metal; a gate manifold comprising a gate manifold body, a first angled gate tab, and a second angled gate tab; and a drain metal comprising a first drain metal contact and a second drain metal contact. The first angled gate tab extends at a first angle from the gate manifold and the second angled gate tab extends at a second angle from the gate manifold body. The first angled gate tab comprises a first region contacting and extending from a first corner of the gate manifold body and a second region extending from the first region of the first angled gate tab, and the second angled gate tab comprises a first region contacting and extending from a second corner of the gate manifold body and a second region extending from the first region of the second angled gate tab. The first angled gate tab and the second angled gate tab are sized and positioned such that respective contact regions are positioned wider than the drain metal.

In some embodiments, the second region of the first angled gate tab is positioned parallel to and offset from a first side of the gate manifold body, and the second region of the second angled gate tab is positioned parallel to and offset from a second side of the gate manifold body.

In a fourth aspect, a field effect transistor is described having a source-connected shielding. The field effect transistor includes a gate manifold, a first source metal, and a second source metal; a drain metal positioned between the first source metal and the second source metal; and a shielding having a first end connected to the first source metal and a second end connected to the second source metal, the shielding being positioned between the gate manifold and the drain contacts. A width of the shielding may be approximately 10 µm to approximately 15 µm although the embodiments described herein are not limited to these dimensions.

In some embodiments, the shielding may include a first stepped region, a second stepped region, and a depressed region positioned between the first stepped region and the second stepped region. The depressed region may directly come into contact with a substrate. The first stepped region and the second stepped region may be raised from a surface of the substrate.

The gate manifold may include a gate manifold body, a first angled gate tab, and a second angled gate tab. The first angled gate tab may be positioned in a recess defined by the first stepped region of the shielding such that the shielding does not contact the first angled gate tab. The second angled gate tab may be positioned in a recess defined by the second stepped region of the shielding such that the shielding does not contact the second angled gate tab.

Additional transistors may include various combinations of the first aspect, the second aspect, the third aspect, the fourth aspect, and/or additional aspects as described herein. Further, the field effect transistors described above may include a high-electron-mobility transistor (HEMT). Further, the field effect transistors described above may include transistors on various typical microwave semiconductor materials, including but not limited to gallium arsenide (GaAs) and gallium nitride (GaN).

BRIEF DESCRIPTION OF THE DRAWINGS

Many aspects of the present disclosure can be better understood with reference to the following drawings. The components in the drawings are not necessarily to scale, with emphasis instead being placed upon clearly illustrating the principles of the disclosure. Moreover, in the drawings, like reference numerals designate corresponding parts throughout the several views.

FIG. 21 shows a die having a transistor with multiple fingers of conventional field effect transistors.

FIG. 22 shows a die having a transistor with multiple fingers of the field effect transistors described in accordance with various embodiments of the present disclosure.

DETAILED DESCRIPTION

Figure 1:
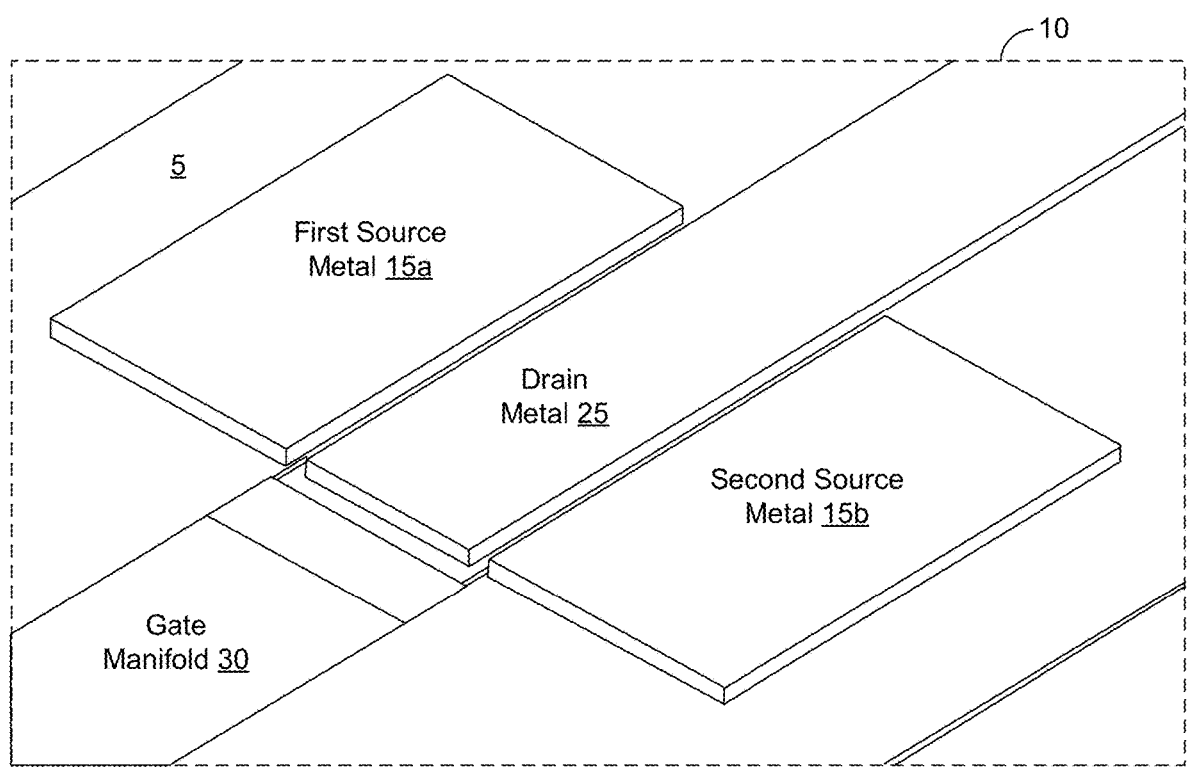
FIG. 1 is a perspective view of a field effect transistor in the related art.

The present disclosure relates to layout techniques and optimizations for semiconductor devices. The concepts described herein are applicable to various types of field effect transistors, among other semiconductor devices, formed using a number of different semiconductor processes and techniques. In some non-limiting examples, the layout techniques and optimizations are applied to gallium nitride (GaN) high-electron mobility transistors (HEMTs), gallium arsenide (GaAs) pseudomorphic high-electron mobility transistors (pHEMTs), metamorphic high-electron mobility transistors (mHEMTs), and/or GaN-on-silicon power amplifier transistors. While various embodiments described herein are described with respect to GaN-on-silicon power transistors, it is understood that the principles and embodiments described herein can be applied to other types of transistors, as will become apparent.

As noted above, parasitic output capacitances can form between drain contacts and a substrate as well as between drain contacts and a back-side ground plane of a die. These parasitic capacitances can have a detrimental effect on the overall RF performance of a device, for example, reducing device gain, power, and efficiency. Accordingly, it is beneficial to increase RF gain of a gallium nitride GaN-on-silicon transistor, or other similar transistor, without changing the fundamental physics of how the transistor intrinsically operates. For instance, instead of changing the intrinsic layout design of a transistor or the properties of the semiconductor material, changes may be made to how the transistor is connected to other devices. These connections are often referred to as the embedding network or metallization.

There are three primary connections to a FET, namely a gate contact, a drain contact, and a source contact. Metallization is provided to electrically couple the connections of one finger to other fingers across multiple FET channels. Without changing the actual structure of the FET, metallization changes can be relied upon to improve a number of different performance characteristics of the FET.

Various embodiments are disclosed for improved and structurally optimized transistors, such as GaN power transistors, on any suitable substrate, as well as other devices as will be described. In a first aspect, a field effect transistor includes a drain metal portion raised from a surface of a substrate. The field effect transistor includes a substrate, a first source metal, a second source metal, and a drain metal positioned between the first source metal and the second source metal. The drain metal includes a first drain metal forming a first drain metal column and a second drain metal column and the field effect transistor comprises a second drain metal. The first drain metal column is positioned below the second drain metal on a first distal end of the second drain metal and the second drain metal column is positioned below the second drain metal on a second distal end of the second drain metal such that the second drain metal is raised from the substrate. An aperture is defined between the first drain metal column and the second drain metal column and below the second drain metal.

The field effect transistor may further include a first source metal and source-connected field plate (SFP), a second source metal and SFP, a first gate finger, and a second gate finger. The first source metal and SFP and the second source metal and SFP are each sized and positioned to include an overhang that defines an overhang aperture in which the gate fingers are positioned, respectively.

In a second aspect, a field effect transistor comprises a drain metal having a notched region. The field effect transistor includes a first source metal, a second source metal, and a drain metal positioned between the first source metal and the second source metal. The drain metal includes a drain metal body having a notched region defining a first projecting portion and a second projecting portion of the drain metal body. The first projecting portion and the second projecting portion of the drain metal body are positioned on respective sides of the notched region. The notched region is a triangular-shaped or a U-shaped notched region in various examples.

In a third aspect, a field effect transistor includes a gate manifold body with angled gate tabs extending from the gate manifold. The field effect transistor includes a source metal; a gate manifold comprising a gate manifold body, a first angled gate tab, and a second angled gate tab; and a drain metal comprising a first drain metal contact and a second drain metal contact.

The first angled gate tab comprises a first region contacting and extending from a first corner of the gate manifold body and a second region extending from the first region of the first angled gate tab. The second angled gate tab comprises a first region contacting and extending from a second corner of the gate manifold body, and a second region extending from the first region of the second angled gate tab.

The first angled gate tab and the second angled gate tab are sized and positioned such that respective contact regions are positioned wider than the drain metal.

In some embodiments, the second region of the first angled gate tab is positioned parallel to and offset from a first side of the gate manifold body, and the second region of the second angled gate tab is positioned parallel to and offset from a second side of the gate manifold body.

In a fourth aspect, a field effect transistor comprises a source-connected shielding. The field effect transistor includes a gate manifold, a first source metal, and a second source metal. The transistor also includes a drain metal positioned between the first source metal and the second source metal, and a shielding having a first end connected to the first source metal and a second end connected to the second source metal, the shielding being positioned between the gate manifold and the drain contacts. A width of the shielding may be approximately 10 μm to approximately 15 μm.

In some embodiments, the shielding may include a first stepped region, a second stepped region, and a depressed region positioned between the first stepped region and the second stepped region. The depressed region may directly come into contact with a substrate. The first stepped region and the second stepped region may be raised from a surface of the substrate.

The gate manifold may include a gate manifold body, a first angled gate tab, and a second angled gate tab. The first angled gate tab may be positioned in a recess defined by the first stepped region of the shielding such that the shielding does not contact the first angled gate tab. The second angled gate tab may be positioned in a recess defined by the second stepped region of the shielding such that the shielding does not contact the second angled gate tab.

Additional transistors may include various combinations of the first aspect, the second aspect, the third aspect, the fourth aspect, and/or additional aspects as described herein. Further, the field effect transistors described herein may be embodied as high-electron-mobility transistors (HEMTs). Further, the field effect transistors described herein can be embodied as gallium nitride (GaN)-on-silicon transistors, GaN-on-silicon-carbide transistors, or GAN transistors formed on other suitable types of substrates.

Turning now to FIG. 1, a perspective view of a field effect transistor 10 is shown. The field effect transistor 10 is provided in FIG. 1 as a reference to a more conventional structure, to highlight the differences as compared to the structural features described below. The features of the field effect transistor 10 are not necessarily drawn to scale in FIG. 1. The field effect transistor 10 can vary in size, shape, proportion, and other aspects as compared to that shown, while still adhering to and incorporating the benefits of the concepts described herein. The field effect transistor 10 can include other structural features not shown in FIG. 1 or, in some cases, can omit one or more of the structural features shown.

In one example, the field effect transistor 10 can be embodied as a GaN-on-silicon power transistor, for example, although it can be formed on other suitable substrates. As shown, the field effect transistor 10 includes source metal 15, drain metal 25, and a gate manifold 30, also referred to as a gate. In some examples, the source metal 15 includes a first source metal 15a and a second source metal 15b disposed on at different locations on a substrate 5.

The field effect transistor 10 can be embodied as a multi-finger planar field effect transistor. A layout of the multi-finger planar field effect transistor consists of inter-digitated contacts for the gate manifold 30, the drain metal 25, and the source metal 15. Conventional transistor layouts use a manifold structure to connect all of the gate contacts on one side of the die, and a similar manifold structure to connect all of the drain contacts on an opposite side of the die. The proximity of the gate manifold to the drain contact metal results in a parasitic capacitance, referred to as gate-drain capacitance ($C_{GD}$), which reduces the usable and stable gain of a semiconductor device.

Figure 2:
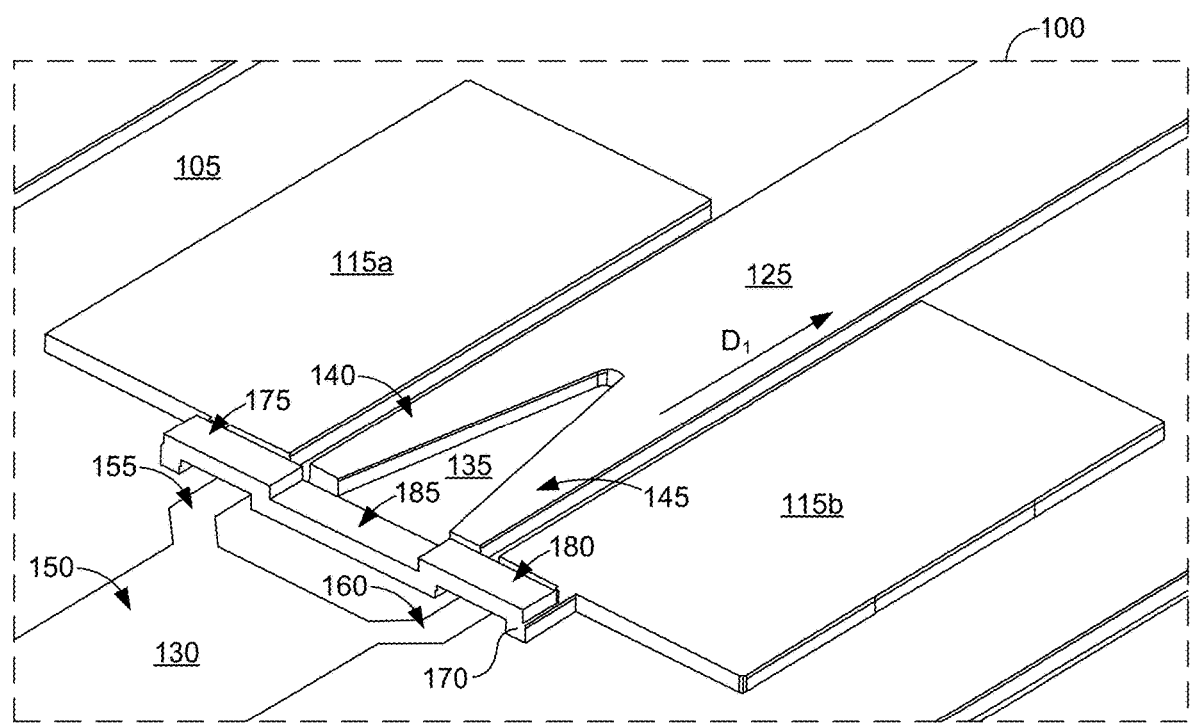
FIGS. 2 and 3 are perspective views of a field effect transistor in accordance with various embodiments of the present disclosure.
Figure 3:
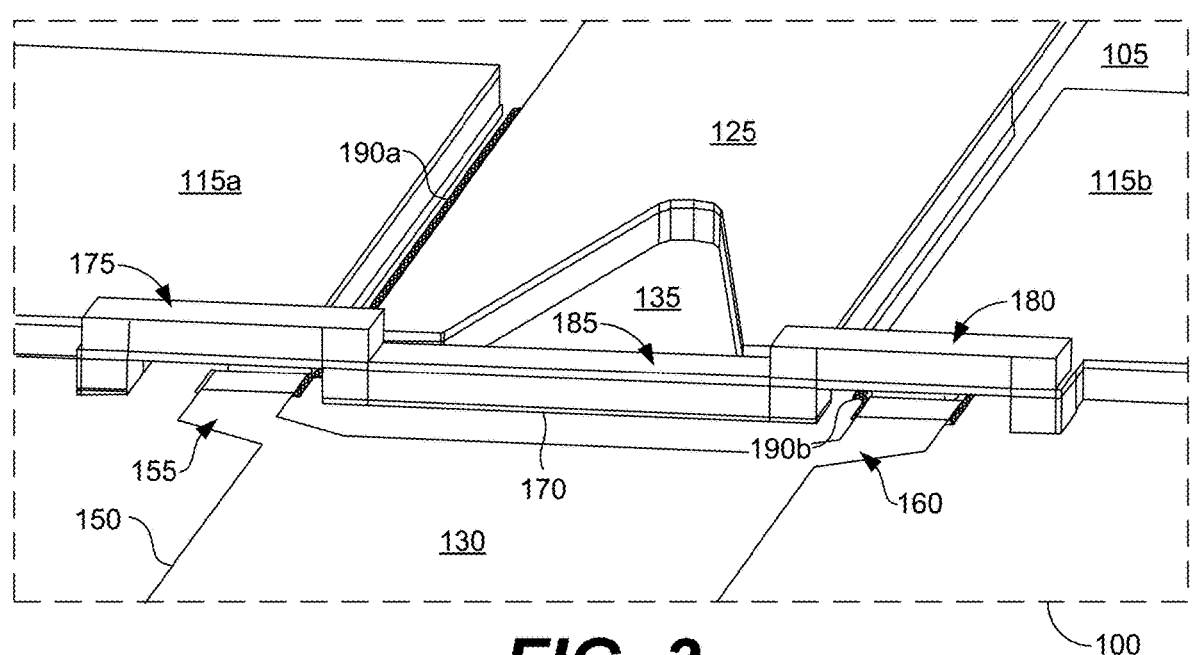

Referring next to FIG. 2 and FIG. 3, together, perspective views of a non-limiting example of a field effect transistor 100 is shown in accordance with various embodiments described herein. The field effect transistor 100 includes a substrate 105, a source metal 115, a drain metal 125, and a gate manifold 130 or a gate. In some examples, the source metal 115 includes a first source metal 115a and a second source metal 115b, where the drain metal 125 is positioned between the first source metal 115a and the second source metal 115b. The first source metal 115a and the second source metal 115b may be positioned on different sides of the drain metal 125. In some embodiments, the gate manifold 130 is formed of a first metal, and the first source metal 115a, the second source metal 115b, and the drain metal 125 are formed of a second metal.

As shown in FIG. 2 and FIG. 3, the drain metal 125 includes a drain metal body having a notched region 135 defining a first projecting portion 140 and a second projecting portion 145 of the drain metal body. The notched region 135 may include an absence of the drain metal 125, as may be appreciated. The first projecting portion 140 and the second projecting portion 145 are positioned on respective sides of the notched region 135. In various embodiments, the notched region 135 is a triangular-shaped notched region. However, in alternative embodiments, the notched region 135 is a U-shaped notched region or other suitable shaped notched region.

It has been observed that most of the current in the drain metal 125 flows towards the drain manifold (e.g., in a direction $D_1$ opposite the gate manifold 130), so portions of the drain metal 125 on the opposite side of the drain manifold do not contribute to flow of current. As such, insignificant current flows in the area of the notched region 135 of the drain metal 125 when the drain metal 125 does not include a notch. As such, the removal of the portion of the drain metal 125 in the notched region 135 has negligible impact on overall performance of the drain metal 125, but significantly reduces area of the drain metal 125 and, thus, reduces the capacitance $C_{DS}$.

Further, the gate manifold 130 of FIGS. 2 and 3 is shown having a structure different than that of the gate manifold 30 of FIG. 1. More specifically, in one or more embodiments, the gate manifold 130 of FIG. 2 may include a gate manifold body 150, a first angled gate tab 155, and a second angled gate tab 160. As the drain metal 125 includes at least a first drain metal contact (not shown) and a second drain metal contact (not shown), the first angled gate tab 155 extends at a first angle from the gate manifold body 150 Similarly, the second angled gate tab 160 extends at a second angle from the gate manifold body. In some embodiments, the gate manifold body 150 is square-shaped or rectangular-shaped.

The first angled gate tab 155 may include a first rectangular region contacting and extending from a first corner of the gate manifold body 150 and a second rectangular region extending from the first rectangular region. The second rectangular region is positioned parallel to and offset from a first side of the gate manifold body 150. Similarly, the second angled gate tab 160 may include a first rectangular region contacting and extending from a second corner of the gate manifold body 150 opposite that of the first corner. The second angled gate tab 160 may further include a second rectangular region extending from the first rectangular region, where the second rectangular region is positioned parallel to and offset from a second side of the gate manifold body 150.

Further, in one or more embodiments, the field effect transistor 100 may include a shielding 170. In some embodiments, the shielding 170 may be positioned between the gate manifold 130 and the drain contacts or, in other words, between the gate manifold 130 and the drain metal 125. The shielding 170 may have a length sufficient (or may be sized and positioned) to contact the first source metal 115a and the second source metal 115b, for instance, without contacting the drain metal 125. As such, the shielding 170 may be referred to as a source-connected shielding 170 in some examples.

Additionally, in some embodiments, the shielding 170 crosses above the connection of the gate manifold 130 to gate fingers 190a, 190b (FIG. 3) and, as such, the shielding 170 does not touch or come into contact with the gate manifold 130 (or, more specifically, the first angled gate tab 155 and the second angled gate tab 160 of the gate manifold 130) or the gate fingers 190. Accordingly, in some embodiments, the shielding 170 includes a first stepped region 175, a second stepped region 180, and a depressed region 185 positioned between the first stepped region 175 and the second stepped region 180. For instance, the first angled gate tab 155 may be positioned in a recess defined by the first stepped region 175 of the shielding 170 and, similarly, the second angled gate tab 160 may be positioned in a recess defined by the second stepped region 180 of the shielding 170. The depressed region 185 may directly touch or come into contact with the substrate 105, whereas the first stepped region 175 and the second stepped region 180 are raised from a surface of the substrate 105.

In some embodiments, the depressed region 185 may include a length the same as or similar to a length of the drain metal 125, where the depressed region 185 of the shielding 170 is positioned directly between the drain metal 125 and the gate manifold 130. In one example, a width of the shielding 170 is approximately 10 µm to approximately 15 µm (±2 µm), although any suitable dimensions can be used for reducing parasitic capacitance.

The field effect transistor 100 of FIG. 2 may include a HEMT in various embodiments. As such, the field effect transistor 100 of FIG. 2 can include a GaN HEMT, GaAs pHEMT, mHEMT, or other type of transistor. In some embodiments, the field effect transistor 100 can be incorporated into a power amplifier, such as a GaN power amplifier, although the field effect transistor 100 can be used as a device component in other circuit designs and for other purposes.

The solution shown in FIGS. 2 and 3 significantly reduces parasitic capacitance by introducing the source-connected shielding 170 between the gate manifold 130 and drain contacts. The embodiments described herein result in electrical, thermal, and reliability improvements via layout changes without imposing material costs. The shielding 170 can be implemented in any standard semiconductor process that provides multiple interconnect metal layers with low-capacitance crossover capability. The solution can be realized by simple process-agnostic layout modifications, allowing the solution to be implemented in various technologies and semiconductor processes.

Figure 4:
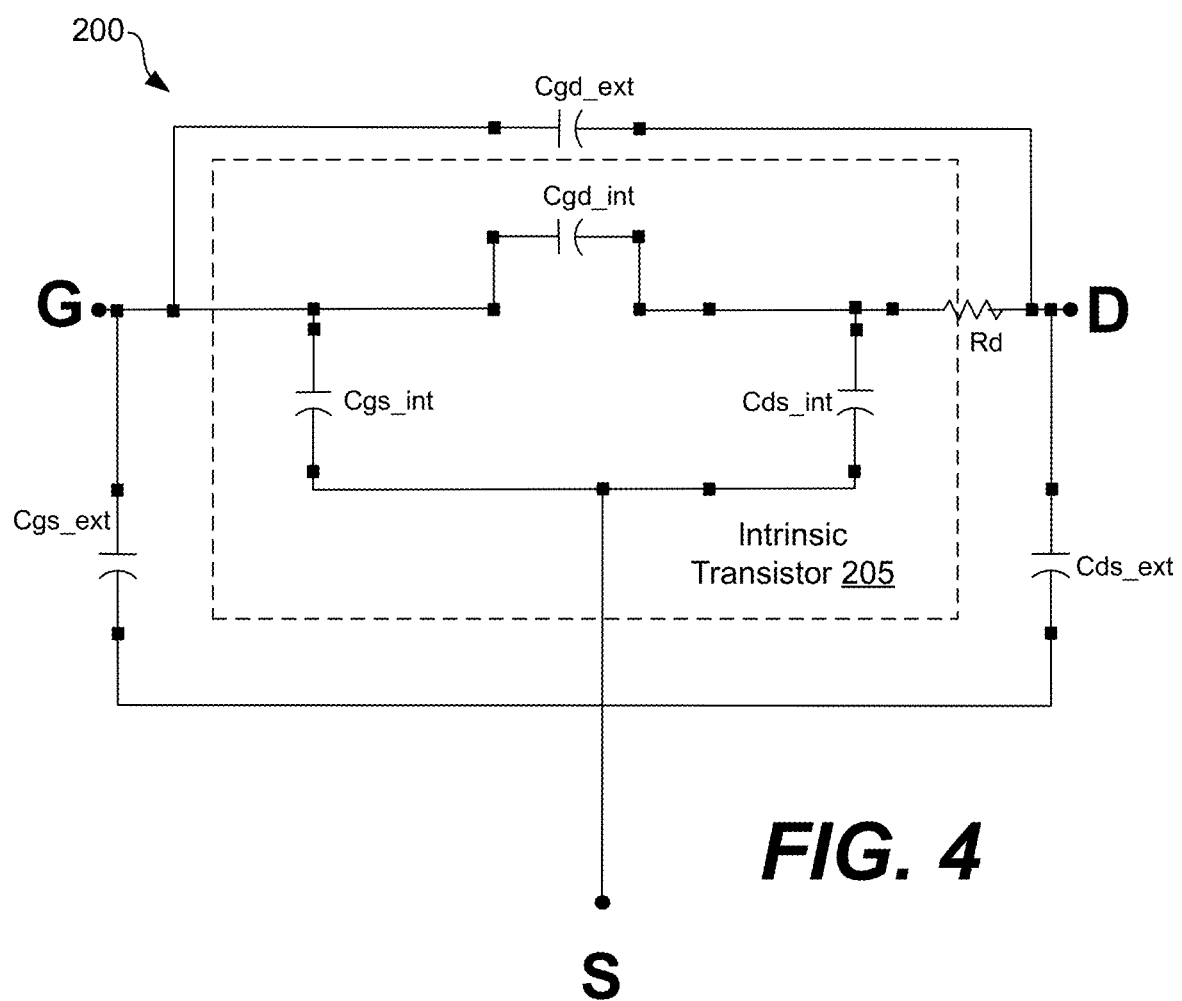
FIG. 4 is a circuit diagram illustrating parasitic capacitances that occur in field effect transistors in accordance with various embodiments of the present disclosure.

Referring next to FIG. 4, a circuit diagram 200 is shown illustrating various parasitic capacitances that occur in field effect transistors 10. More specifically, the capacitances can include parasitic capacitances that are undesirable in many applications. For instance, an intrinsic transistor 205 is shown having three internal parasitic capacitances, Cgs_int, Cds_int, and Cgd_int, where Cgs_int is an internal capacitance occurring between gate and source, Cds_int is an internal capacitance occurring between drain and source, and Cgd_int is an internal capacitance occurring between gate and drain. Outside of the intrinsic transistor 205, additional parasitic capacitances occur, such as Cgs_ext, Cgd_ext, and Cds_ext, where Cgs_ext is an external capacitance occurring between gate and source, Cds_ext is an external capacitance occurring between drain and source, and Cgd_ext is an external capacitance occurring between gate and drain. By reducing the parasitic capacitances shown in FIG. 4, device efficiency for GaN power amplifiers or other similar devices can be increased.

Figure 5:
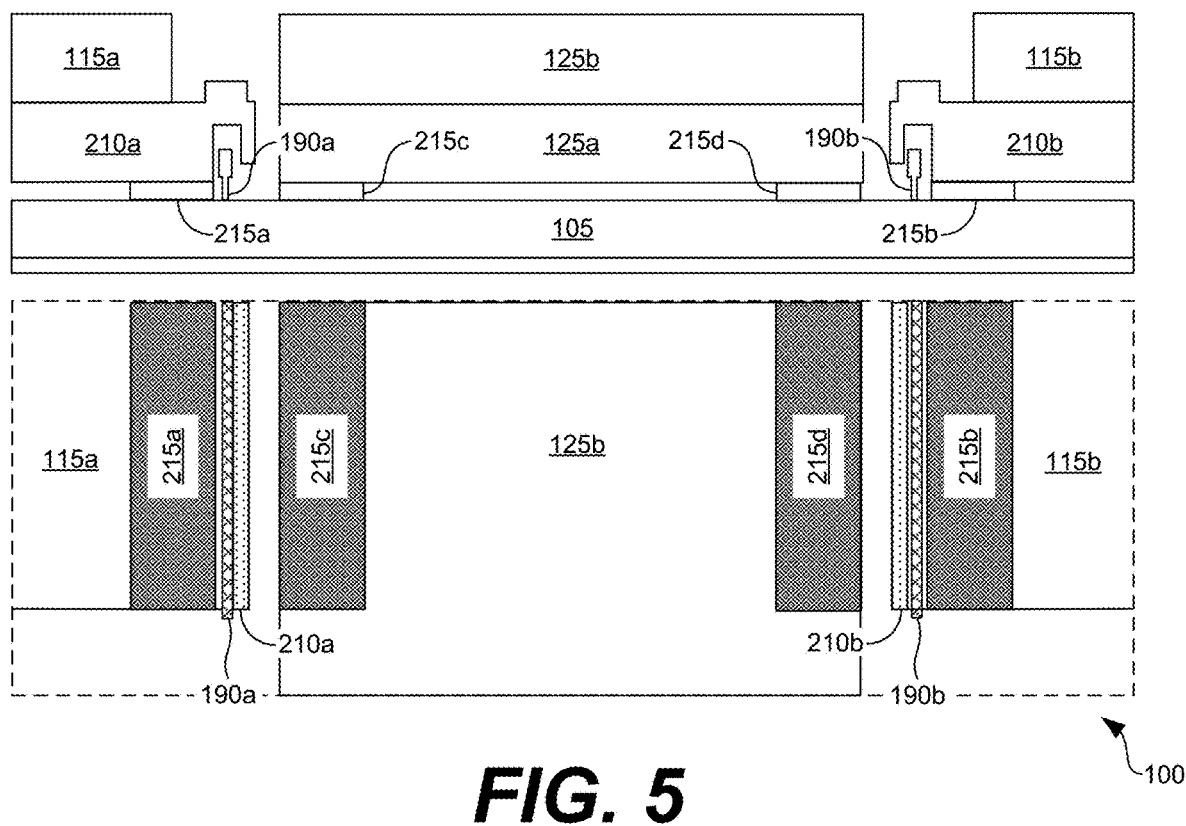
FIG. 5 is side view of a field effect transistor shown relative to a top elevation view of the field effect transistor in accordance with various embodiments of the present disclosure.

Moving along to FIG. 5, a side view of a field effect transistor 100 is shown relative to a top elevation view of the field effect transistor 100 in accordance with various embodiments of the present disclosure. Notably, FIG. 5 depicts an embodiment where the drain metal 125 and the source metal 115 are raised from a surface of ohmic contacts and/or a substrate 105, thereby reducing parasitic capacitance. The field effect transistor 100 includes a first drain metal 125a of a first metal material and a second drain metal 125b of a second metal material that can be different than the first metal material.

The field effect transistor 100 further includes a first source metal 115a and a second source metal 115b that can be made of a same metal material. Below the first source metal 115a, a first source metal and source-connected field plate (SFP) 210a may be positioned above a first ohmic contact 215a. Similarly, below the second source metal 115b, a second source metal and SFP 210b may be positioned above a second ohmic contact 215b. The first ohmic contact 215a and the second ohmic contact 215b may include source ohmic contacts, as may be appreciated.

Additionally, a third ohmic contact 215c is positioned below a first distal end of the first drain metal 125a and a fourth ohmic contact 215d is positioned below a second distal end (opposite the first distal end) of the first drain metal 125a, defining an aperture between the third ohmic contact 215c and the fourth ohmic contact 215d. The aperture is further positioned below the first drain metal 125a and the second drain metal 125b. The third ohmic contact 215c and the fourth ohmic contact 215d may include drain ohmic contacts, as may be appreciated.

In a conventional field effect transistor 10, the ohmic contacts span an entire width of the drain metal 125, as can be appreciated. However, as shown in FIG. 5, a width of the first ohmic contact 215a and the second ohmic contact 215b is less than a bottom width of the first source metal and SFP 210a and the second source metal and SFP 210b, respectively. For instance, by raising the source metal and SFPs 210 as well as the drain metals 125 from the substrate 105 and/or ohmic contacts 215, parasitic capacitance in the field effect transistor 100 is reduced.

Figure 6:
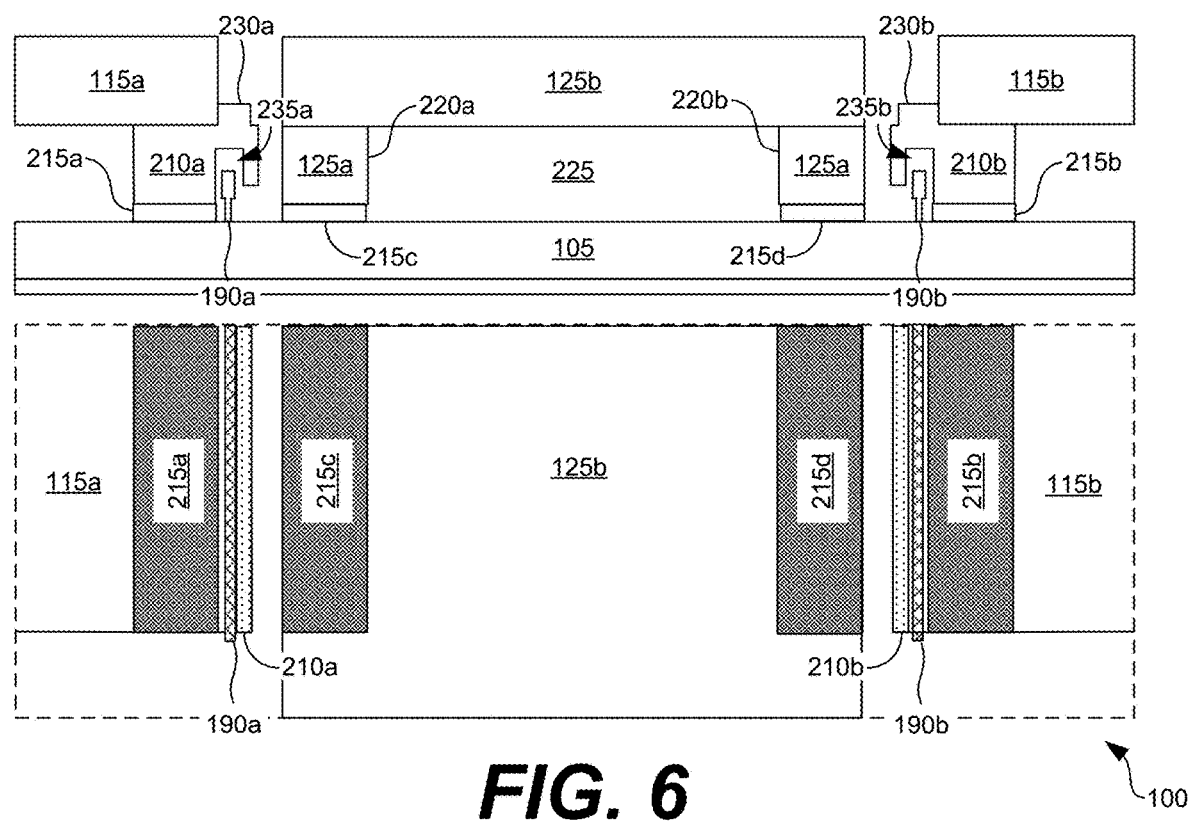
FIG. 6 is another side view of a field effect transistor shown relative to a top elevation view of the field effect transistor in accordance with various embodiments of the present disclosure.

Referring now to FIG. 6, another side view of a field effect transistor 100 is shown relative to a top elevation view of the field effect transistor 100 in accordance with various embodiments of the present disclosure. Specifically, FIG. 6 depicts an embodiment where the drain metal 125 and the source metal 115 are raised from a surface of ohmic contacts and/or a substrate 105, thereby reducing parasitic capacitance. However, when compared with the field effect transistor 100 of FIG. 5, the first drain metal 125a is split into a first drain metal column 220a and a second drain metal column 220b, where an aperture 225 is defined between the first drain metal column 220a and the second drain metal column 220b. The field effect transistor 100 includes a first drain metal 125a of a first metal material and a second drain metal 125b of a second metal material where, in some embodiments, the second metal material can be different than that of the first metal material.

Similar to FIG. 5, the field effect transistor 100 of FIG. 6 further includes a first source metal 115a and a second source metal 115b that can be made of a same metal material. Below the first source metal 115a, a first source metal and SFP 210a may be positioned above a first ohmic contact 215a. Similarly, below the second source metal 115b, a second source metal and SFP 210b may be positioned above a second ohmic contact 215b.

Additionally, a third ohmic contact 215c is positioned below a first distal end of the first drain metal 125a and a fourth ohmic contact 215d is positioned below a second distal end (opposite the first distal end) of the first drain metal 125a, defining an aperture between the third ohmic contact 215c and the fourth ohmic contact 215d. The aperture is further positioned below the first drain metal 125a and the second drain metal 125b. In a conventional field effect transistor 10, the ohmic contacts span an entire width of the drain metal 125, as can be appreciated.

Notably, a width of the first ohmic contact 215a and the second ohmic contact 215b is less than a bottom width of the first source metal and SFP 210a and the second source metal and SFP 210b, respectively. In some embodiments, the third ohmic contact 215a has a width the same as or substantially similar to a width of the first source metal column 215c. For instance, by raising the source metal and SFPs 210 as well as the drain metals 125 from the substrate 105 and/or ohmic contacts 215, parasitic capacitance in the field effect transistor 100 is reduced.

Referring to FIGS. 5 and 6 collectively, the source metal and SFPs 210 each are sized and positioned to include an overhang 230a, 230b, respectively. Each overhang 230 defines an overhang aperture 235a, 235b in which the gate fingers 190a, 190b are respectively positioned such that the source metal and SFPs 210 do not contact the gate fingers 190a, 190b, while not interfering with normal operation of the gate fingers 190a, 190b.

Figure 23:
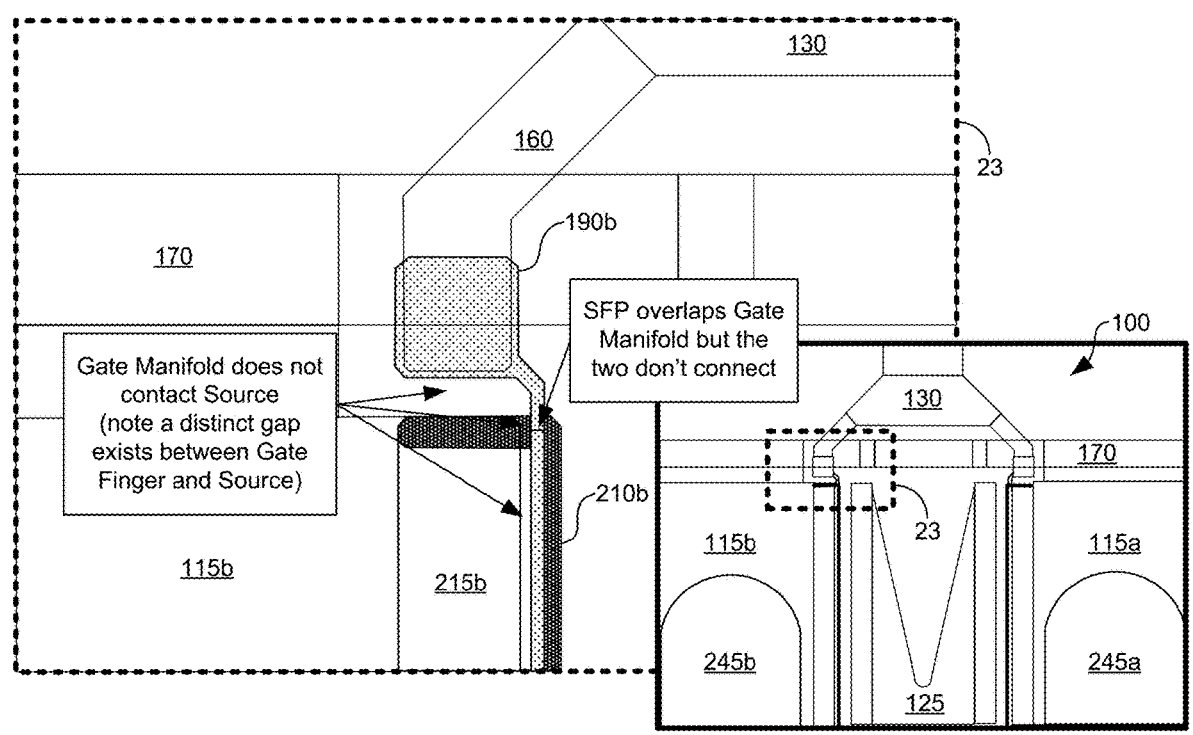
FIG. 23 is an enlarged top elevation views of a field effect transistor in accordance with various embodiments of the present disclosure.

Referring ahead to FIG. 23, for example, an enlarged top down view of the field effect transistor 100 is shown. Looking at the enlarged callout region 23, the gate manifold 130 is shown as not contacting the source metal 115b. More specifically, a distinct gap can be observed between the gate finger 190b and the source metal 115b. Additionally, the SFP 210b may overlap the gate manifold 130; however, the SFP 210b does not contact or connect to the gate manifold 130.

Figure 7:
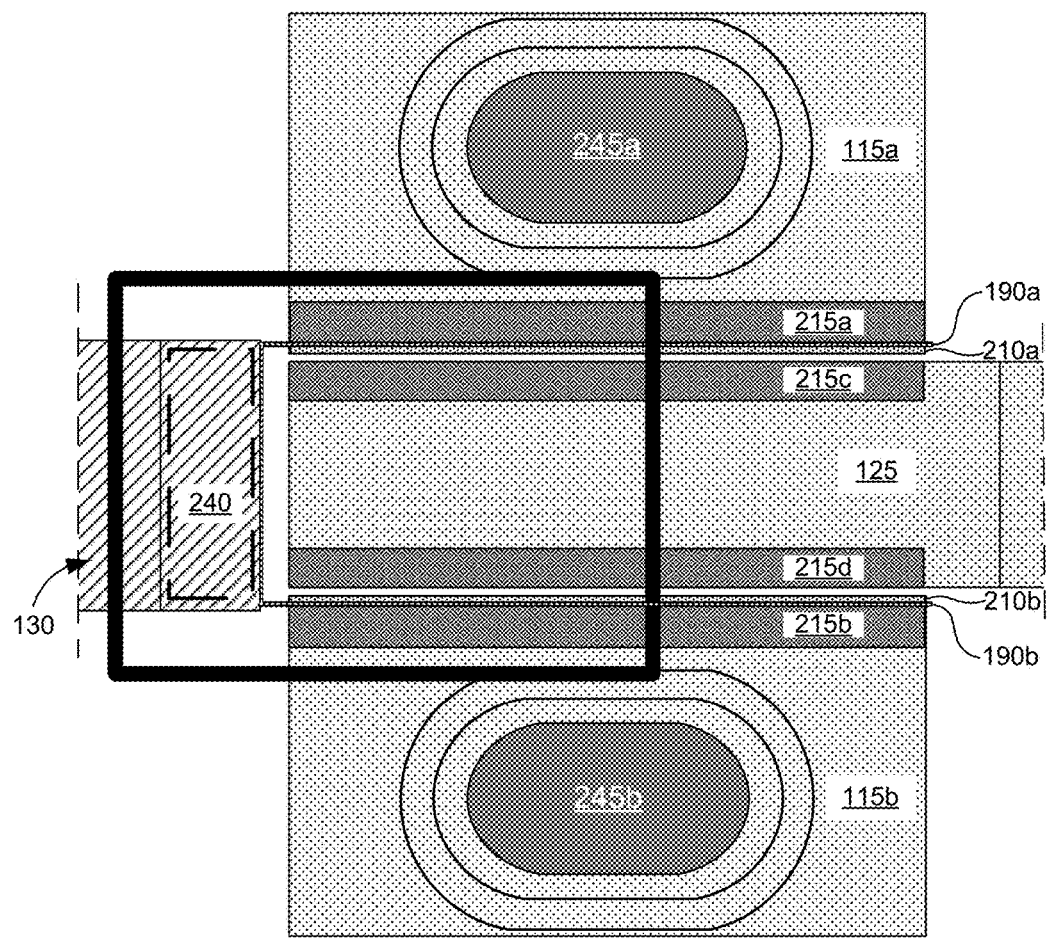
FIG. 7 is a top elevation view of a field effect transistor in accordance with various embodiments of the present disclosure.

Referring now to FIG. 7, a top elevation view of a field effect transistor 100 is shown in accordance with various embodiments of the present disclosure. For instance, FIG. 7 illustrates a top view of a semiconductor die having a GaN or similar type of transistor. For instance, a number of cells shown in FIG. 7 can be stacked on top of another to form a larger field effect transistor 100. Parasitic capacitances occur at two notable regions. The drain contact traditionally couples to the back-side ground plane of a semiconductor, which creates a parasitic drain-source capacitance $C_{DS}$. Another notable capacitance occurs between the gate manifold 130 on the left side and the drain metal 125 on the right side of the diagram. The proximity of those metals creates a parasitic capacitance, referred to as $C_{GD}$.

In FIG. 7, a traditional type of gate manifold 130 is shown having a gate contact region 240. Additionally, source connections 245a, 245b of the field effect transistor 100 are shown. The parasitic output capacitance ($C_{DS}$) is formed between drain contacts (e.g., the ohmic contact 215c and fourth ohmic contact 215d) and the substrate 105, and/or back-side ground plane of the die. This output capacitance has detrimental effects on overall device RF performance, namely a reduction in device efficiency and bandwidth. By raising the drain metal 125 from the substrate 105, the magnitude of the parasitic capacitance is minimized by reducing the proximity of the drain metallization to the substrate 105 and a back-side ground plane. The embodiment can be realized by a very simple process-agnostic layout modification, allowing the solution to be implemented in various technologies and semiconductor processes. While the embodiment described above where the drain metal 125 is raised from the substrate 105 is shown, the shielding 170 and the notched region 135 of the drain metal 125 are not included in the embodiment of FIG. 7.

Figure 8:
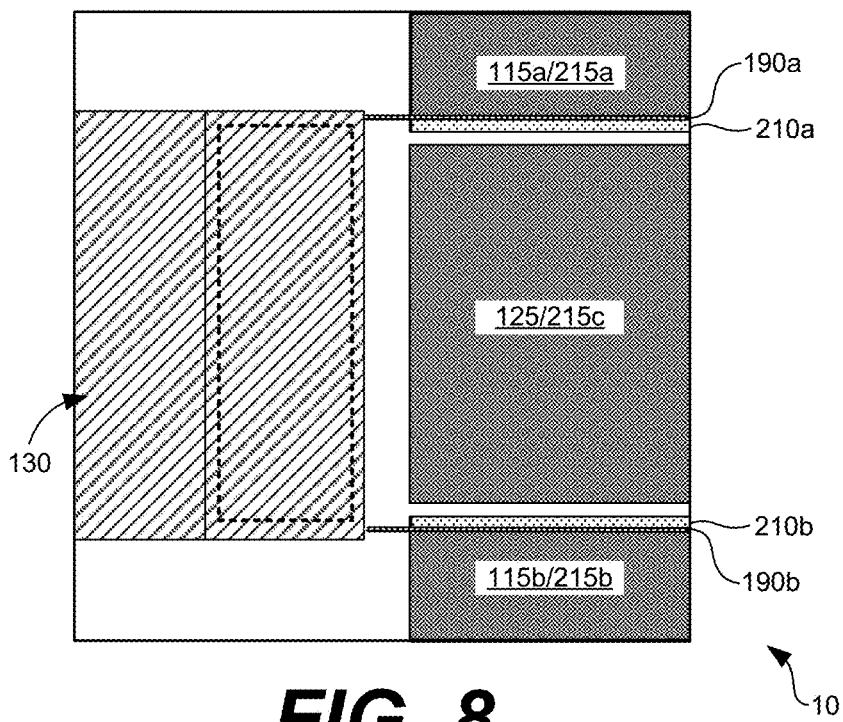
FIG. 8 is a top elevation view of a field effect transistor in the related art.

Moving on to FIG. 8, a top elevation view of a field effect transistor 10 is shown as is conventional in the related art. Notably, the ohmic contacts 215a, 215b, and 215c span an entirety of the first source metal 115a, the second source metal 115b, and the drain metal 125, respectively, creating large parasitic capacitances that affect semiconductor device efficiency.

Figure 9:
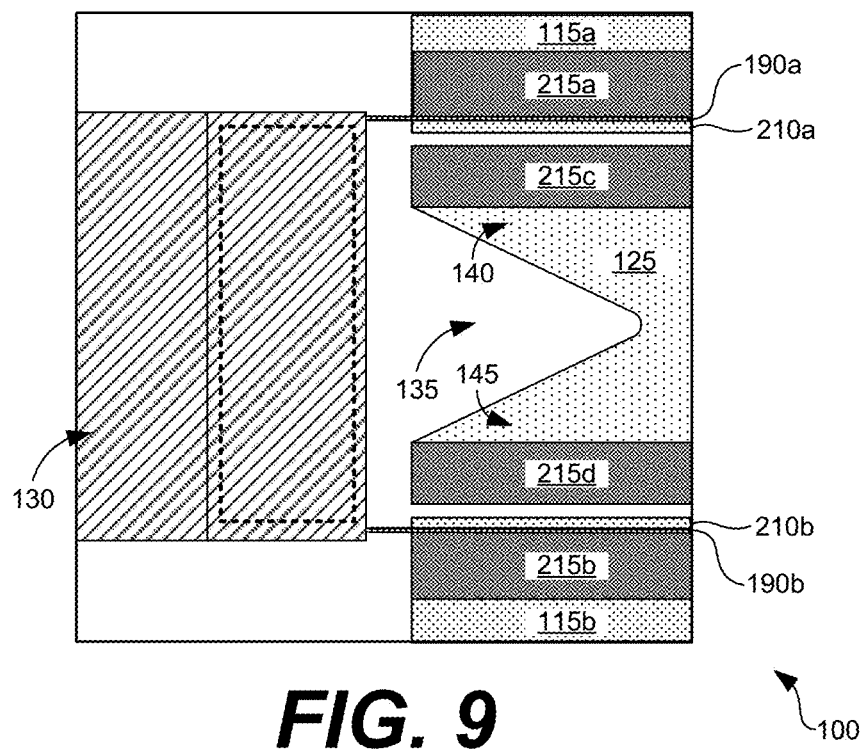
FIGS. 9-12 are top elevation views of a field effect transistor in accordance with various embodiments of the present disclosure.

Turning now to FIG. 9, a top elevation view of a field effect transistor 100 is shown in accordance with various embodiments of the present disclosure. Specifically, the embodiment of the field effect transistor 100 of FIG. 9 includes the drain metal 125 being raised from the substrate 105, as shown in FIG. 5 or FIG. 6. Additionally, the embodiment of the field effect transistor 100 of FIG. 9 shows the notched region 135 being provided in the drain metal 125. A conventional type of gate manifold 130 is shown and the embodiment of FIG. 9 does not include the shielding 170 described with respect to FIGS. 2 and 3.

Figure 10:
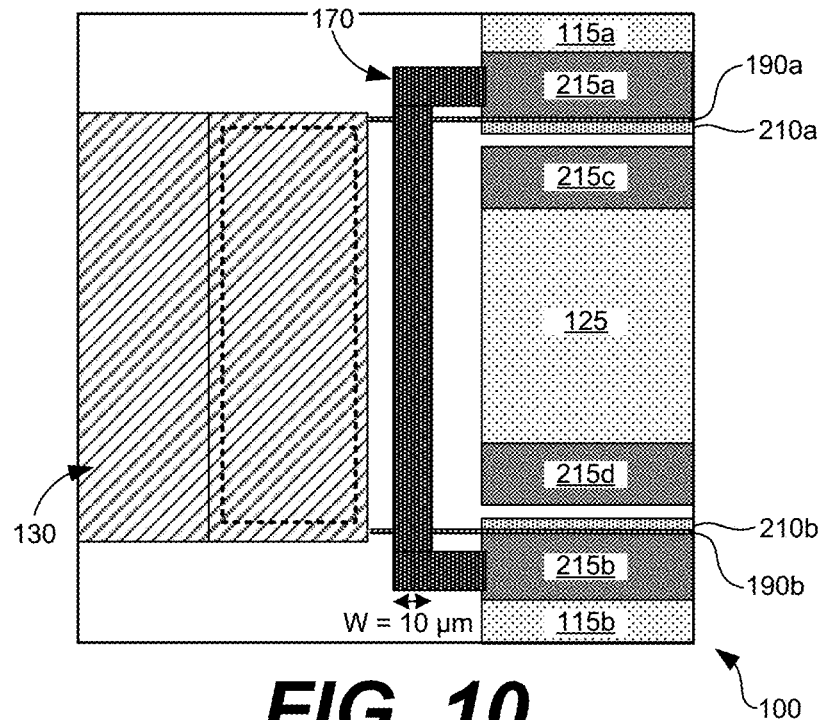
Figure 11:
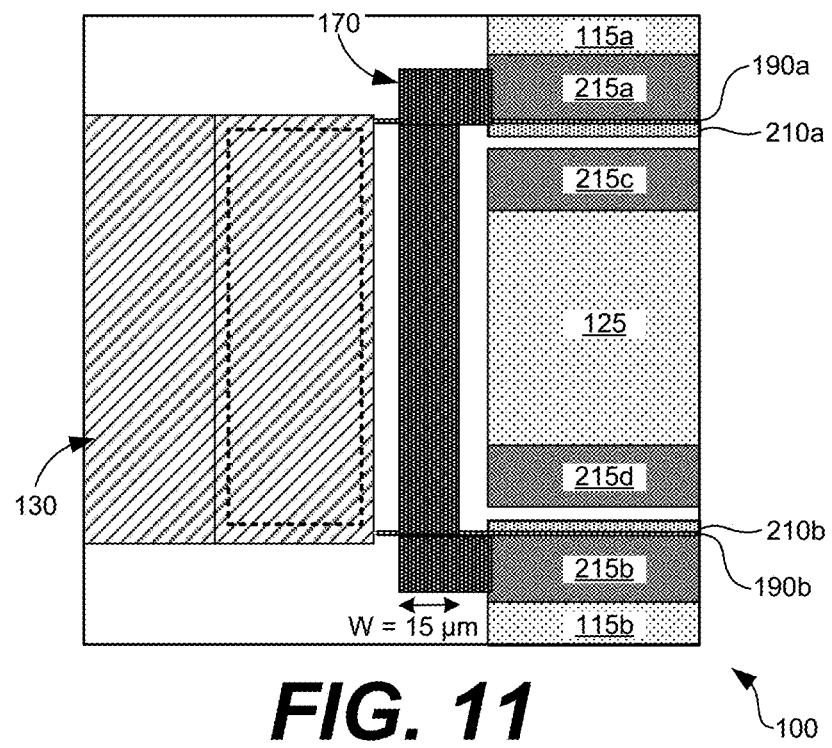

Moving along to FIGS. 10 and 11, a top elevation view of a field effect transistor 100 is shown in accordance with various embodiments of the present disclosure. The embodiments of the field effect transistor 100 of FIGS. 10 and 11 include the drain metal 125 being raised from the substrate 105, as shown in FIG. 5 or FIG. 6. Additionally, the embodiments of the field effect transistor 100 of FIGS. 10 and 11 show a shielding 170 being provided therein. The shielding 170 is shown being positioned between the gate manifold 130 and the drain contacts or, in other words, between the gate manifold 130 and the drain metal 125. The shielding 170 may have a length sufficient (or may be sized and positioned) to contact the first source metal 115a and the second source metal 115b, for instance, without contacting the drain metal 125. As such, the shielding 170 may be referred to as a source-connected shielding 170 in some examples. A conventional type of gate manifold 130 is shown in the field effect transistor 100 and the embodiments of FIGS. 10 and 11 do not include the notched region 135 described with respect to FIGS. 2 and 3.

The shielding 170 may cross above a connection of the gate manifold 130 to gate fingers 190a, 190b and, as such, the shielding 170 does not touch or come into contact with the gate manifold 130 or the gate fingers 190. However, the gate manifold 130 may form connections with the gate fingers 190. Specifically, in the embodiment of FIG. 10, the width W of the shielding 170 is approximately 10 μm whereas in the embodiment of FIG. 11, the width W of the shielding 170 is approximately 15 μm, although other suitable widths may be employed. However, it has been observed that 10 μm to 15 μm is a desirable range for the width of the shielding 170.

Figure 12:
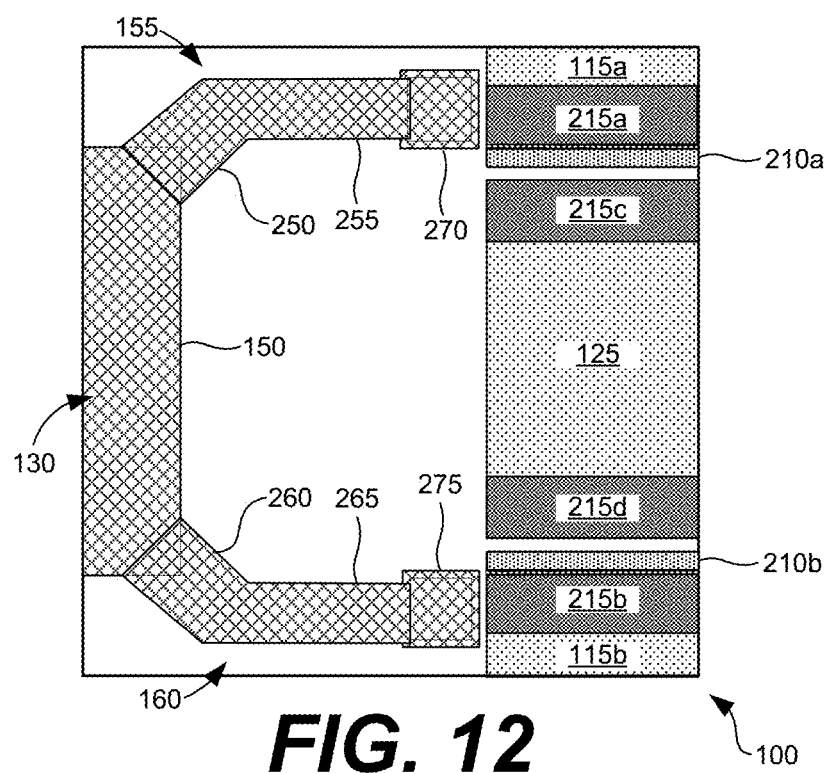

Referring now to FIG. 12, a top elevation view of a field effect transistor 100 is shown in accordance with various embodiments of the present disclosure. Specifically, the embodiment of the field effect transistor 100 of FIG. 12 includes the drain metal 125 being raised from the substrate 105, as shown in FIG. 5 or FIG. 6. Additionally, the embodiment of the field effect transistor 100 of FIG. 12 shows the gate manifold 130 having a structure different than that of the gate manifold 130 of FIGS. 8-11.

More specifically, in one or more embodiments, the gate manifold 130 includes a gate manifold body 150, a first angled gate tab 155, and a second angled gate tab 160. As the drain metal 125 is positioned on the third ohmic contact 215c (e.g., a first drain metal contact) and the fourth ohmic contact (e.g., a second drain metal contact), the first angled gate tab 155 extends at a first angle from the gate manifold body 150 and can contact the first drain metal contact. Similarly, the second angled gate tab 160 extends at a second angle from the gate manifold body 150 and contacts the second drain metal contact. In some embodiments, the gate manifold body 150 is square-shaped or rectangular-shaped.

The first angled gate tab 155 may include a first rectangular region 250 contacting and extending from a first corner of the gate manifold body 150 and a second rectangular region 255 extending from the first rectangular region 250. The second rectangular region 255 is positioned parallel to and offset from the gate manifold body 150. Similarly, the second angled gate tab 160 may include a first rectangular region 260 contacting and extending from a second corner of the gate manifold body 150 opposite that of the first corner. The second angled gate tab 160 may further include a second rectangular region 265 extending from the first rectangular region, where the second rectangular region is positioned parallel to and offset from the gate manifold body 150.

In some embodiments, the first angled gate tab 155 includes a contact region 270 that may be square or rectangular shaped. Similarly, in some embodiments, the second angled gate tab 160 includes a contact region 275 that may be square or rectangular shaped. The first angled gate tab 155 and the second angled gate tab 160 are sized and positioned such that the contact regions 270, 275 are positioned wider than the drain metal 125.

Figure 13:
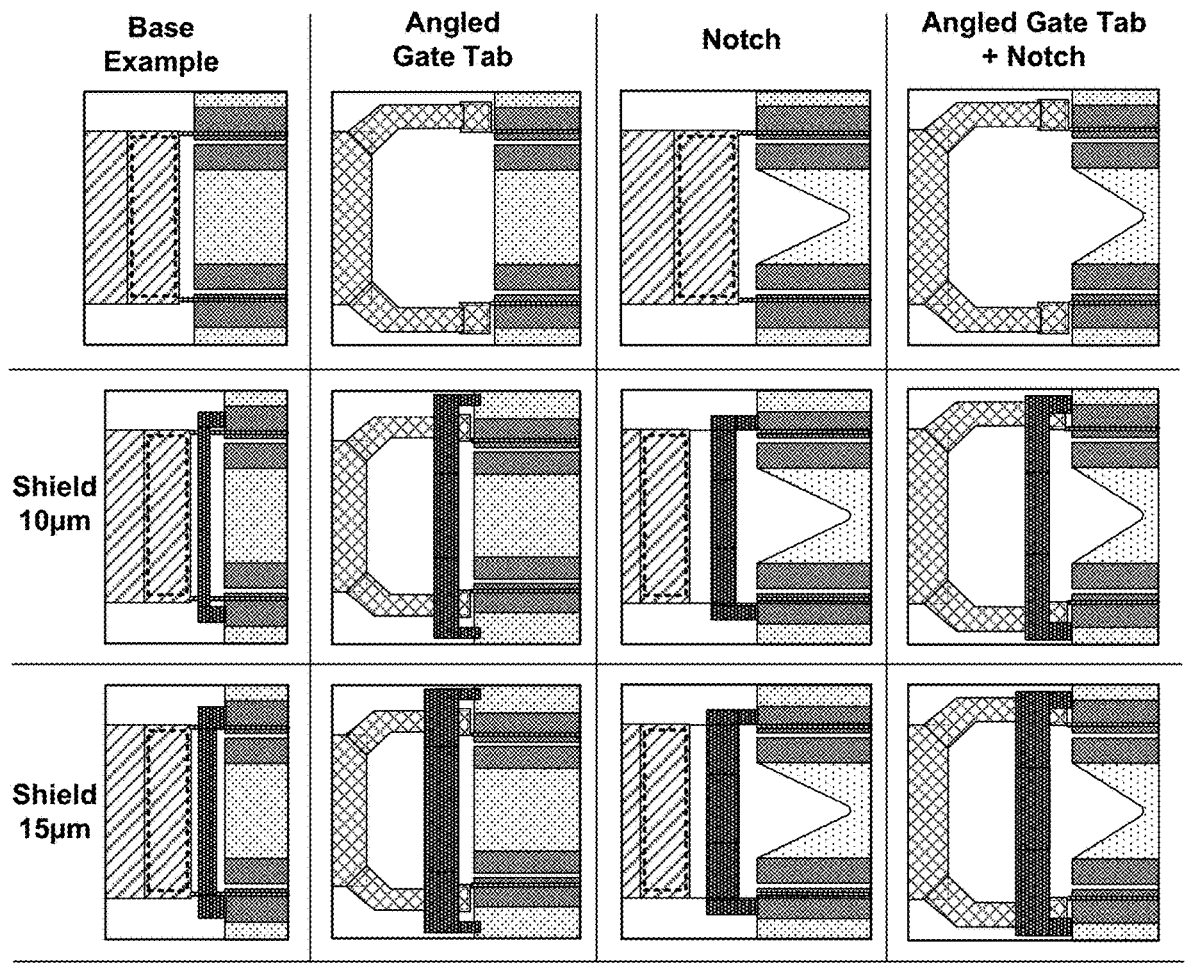
FIG. 13 is a diagram illustrating various combinations of components of the field effect transistor in accordance with various embodiments of the present disclosure.

FIG. 13 is a diagram illustrating various combination of components of the field effect transistor 100 described in accordance with various embodiments of the present disclosure. For instance, various combinations are shown of (a) the drain metal 125 and/or source metal 115 being raised from the substrate 105; (b) the gate manifold 130 having angled gate tabs 155, 160; (c) the drain metal 125 having a notched region 135; and/or (d) the shielding 170 being positioned between the gate manifold 130 and the drain and source metals. It is understood that all combinations of these embodiments are intended to be disclosed by the present disclosure.

Figure 14:
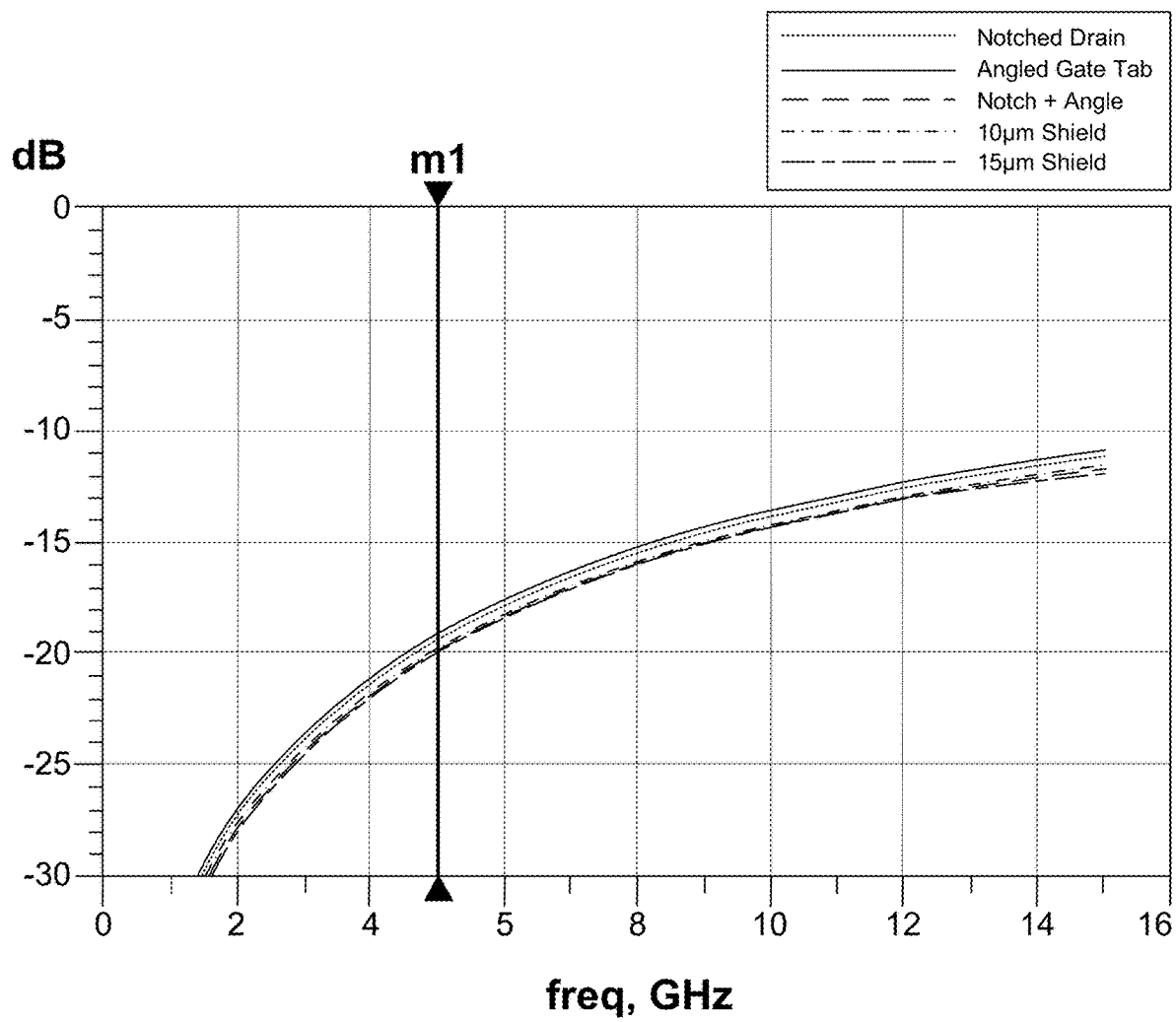
FIGS. 14 and 15 are charts illustrating electromagnetic (EM) simulation results of the field effect transistor in accordance with various embodiments of the present disclosure.
Figure 15:
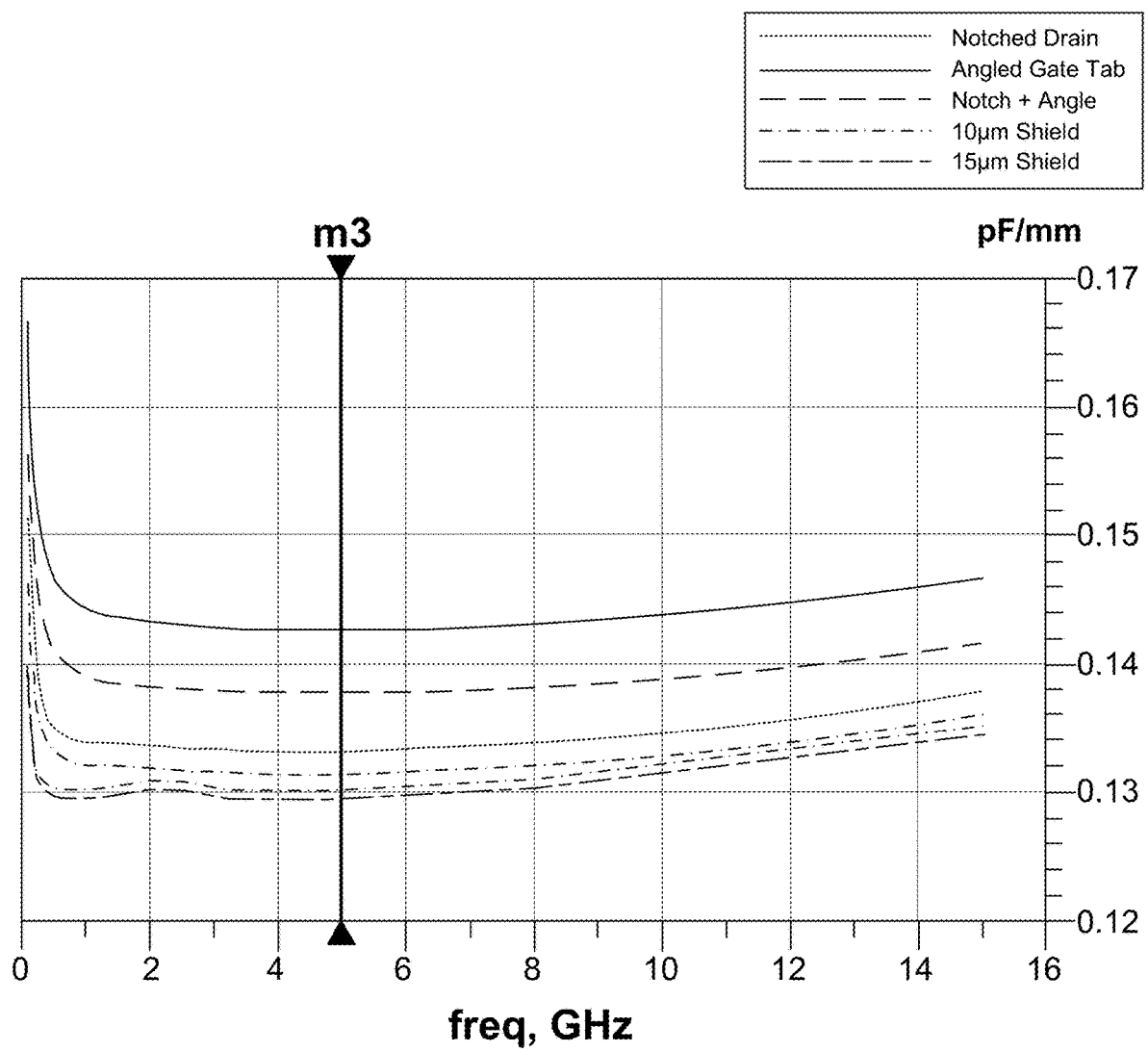

FIGS. 14 and 15 are charts illustrating electromagnetic (EM) simulation results of various combinations of the embodiments of the field effect transistor 100 described herein in accordance with the present disclosure. Specifically, FIG. 14 shows $S_{12}$ scattering parameters ($S_{12}$[db]) whereas FIG. 15 shows ground-drain capacitance $C_{GD}$ measured in pF/mm. The marker m1 and marker m3 show values at 5 GHz.

It can be observed from FIGS. 14 and 15 that all modifications lower $S_{12}/C_{GD}$. Notably, the angled gate tabs 155, 160 are approximately two times as effective compared to the notched region 135 of the drain metal 125. The shielding 170 is approximately four times as effective compared to the notched region 135 of the drain metal 125. The differences between the shielding 170 having a width of 10 μm and the shielding 170 having a width of 15 μm is marginal. However, the combination of the shielding 170, the notched region 135 of the drain metal 125, and the angled gate tabs 155, 160 yields the best results.

Figure 16:
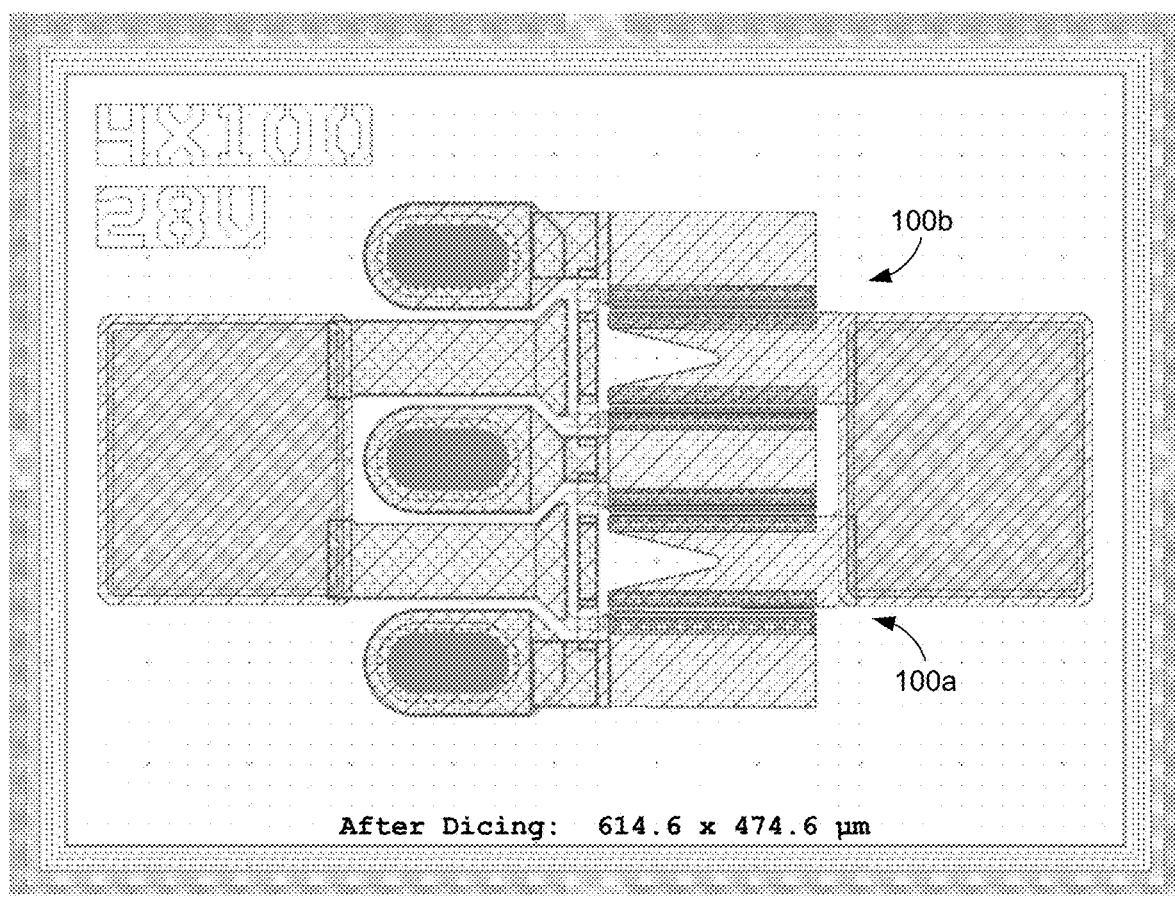
FIG. 16 is an example of a die layout for a transistor having multiple fingers of field effect transistors positioned in parallel in accordance with various embodiments of the present disclosure.

FIG. 16 is an example of a die layout for a single transistor comprising multiple "fingers" of the field effect transistors 100a, 100b in accordance with various embodiments of the present disclosure. More specifically, an example of a 28 V conversion of a standard 0.22 mm driver die is illustrated.

Figure 17:
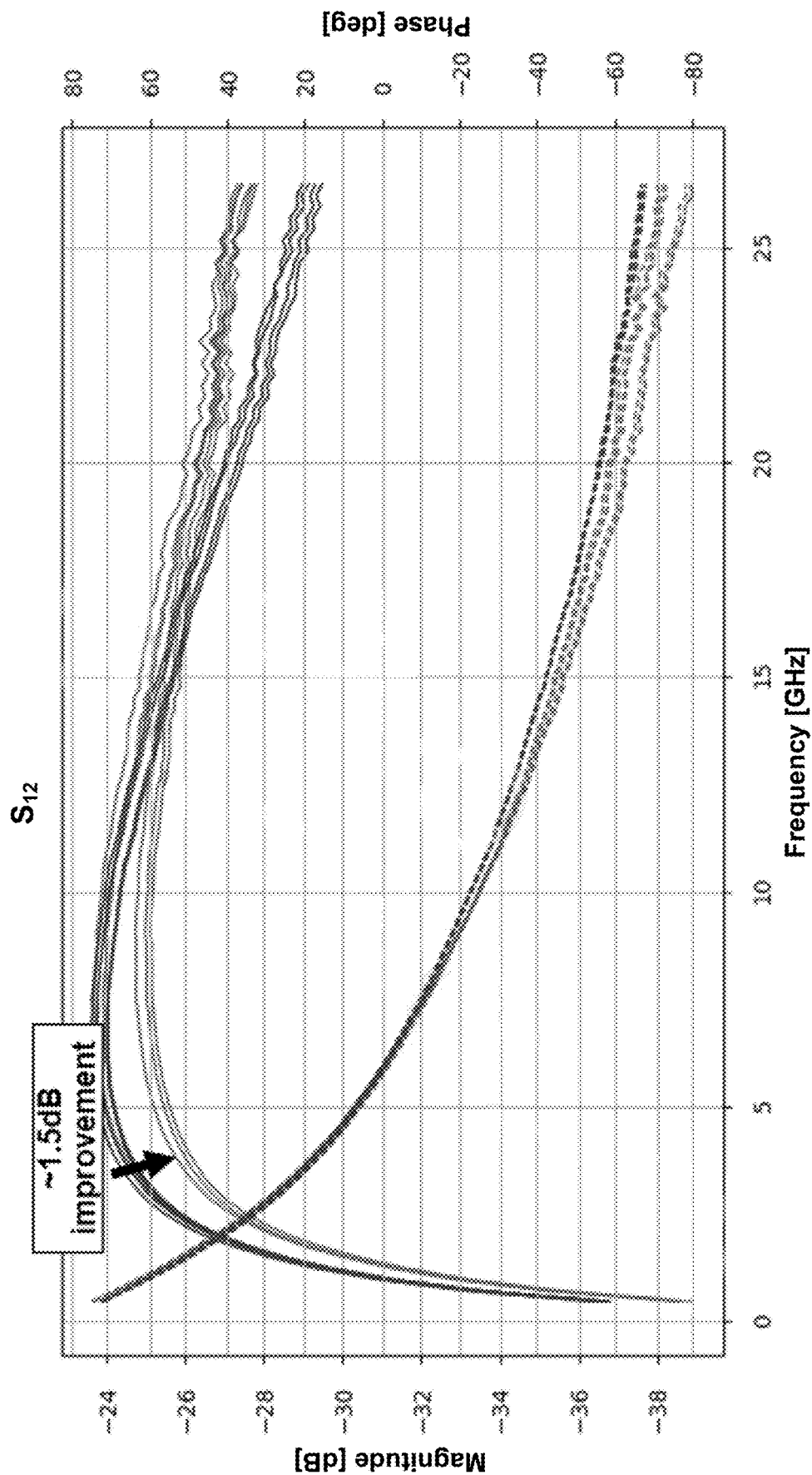
FIGS. 17-20 are charts illustrating measured results of the field effect transistor in accordance with various embodiments of the present disclosure.
Figure 18:
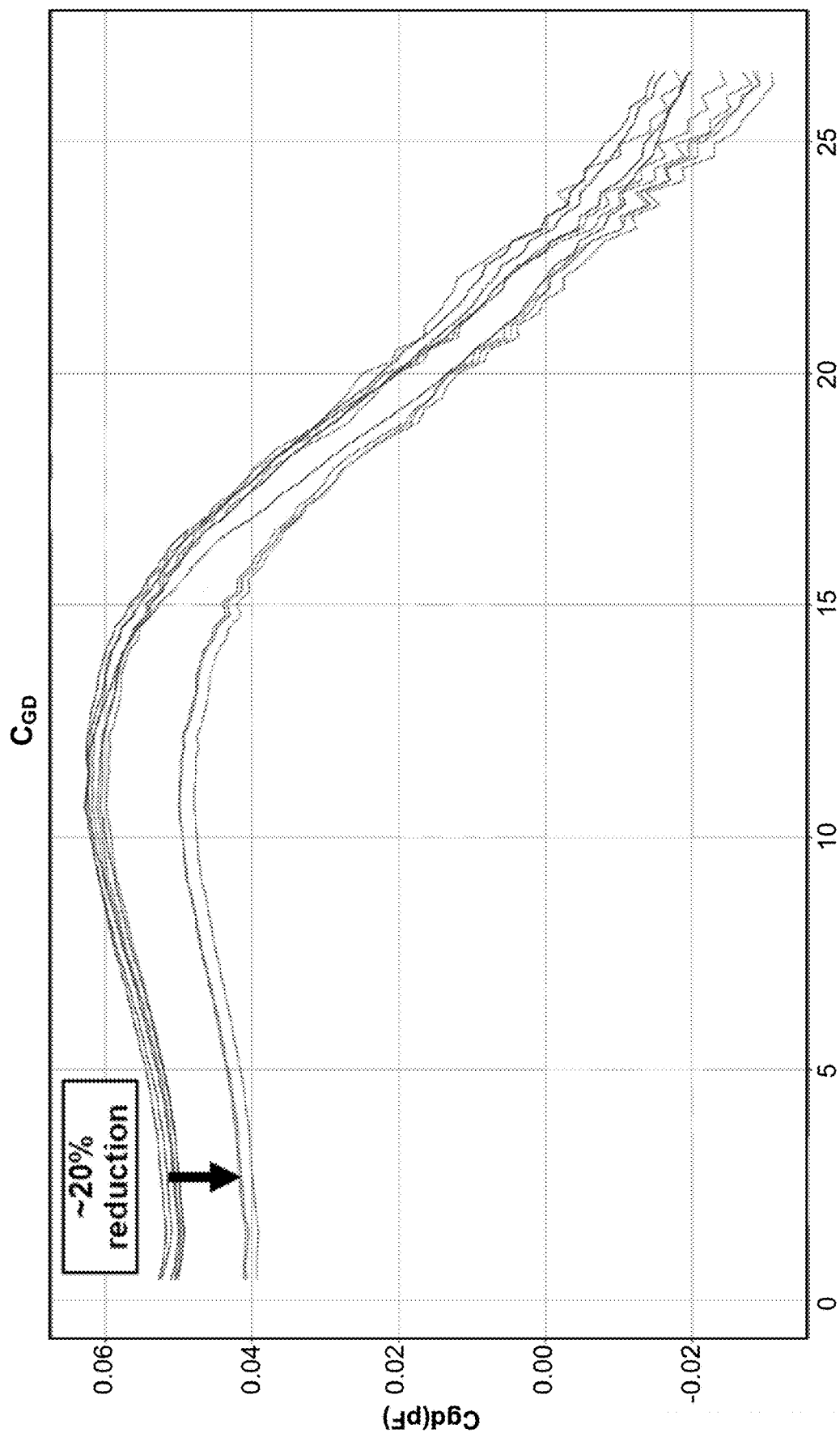
Figure 19:
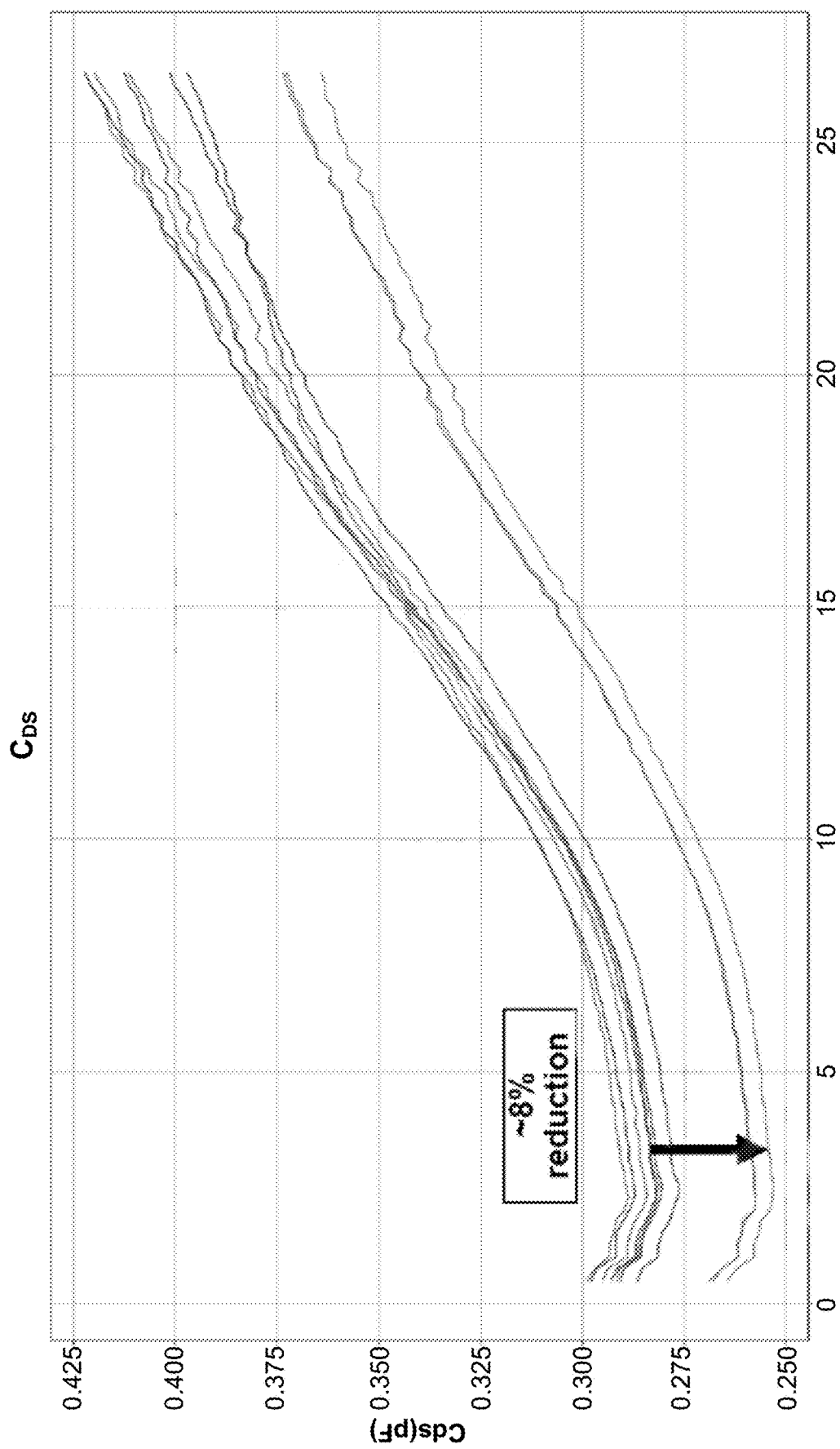
Figure 20:
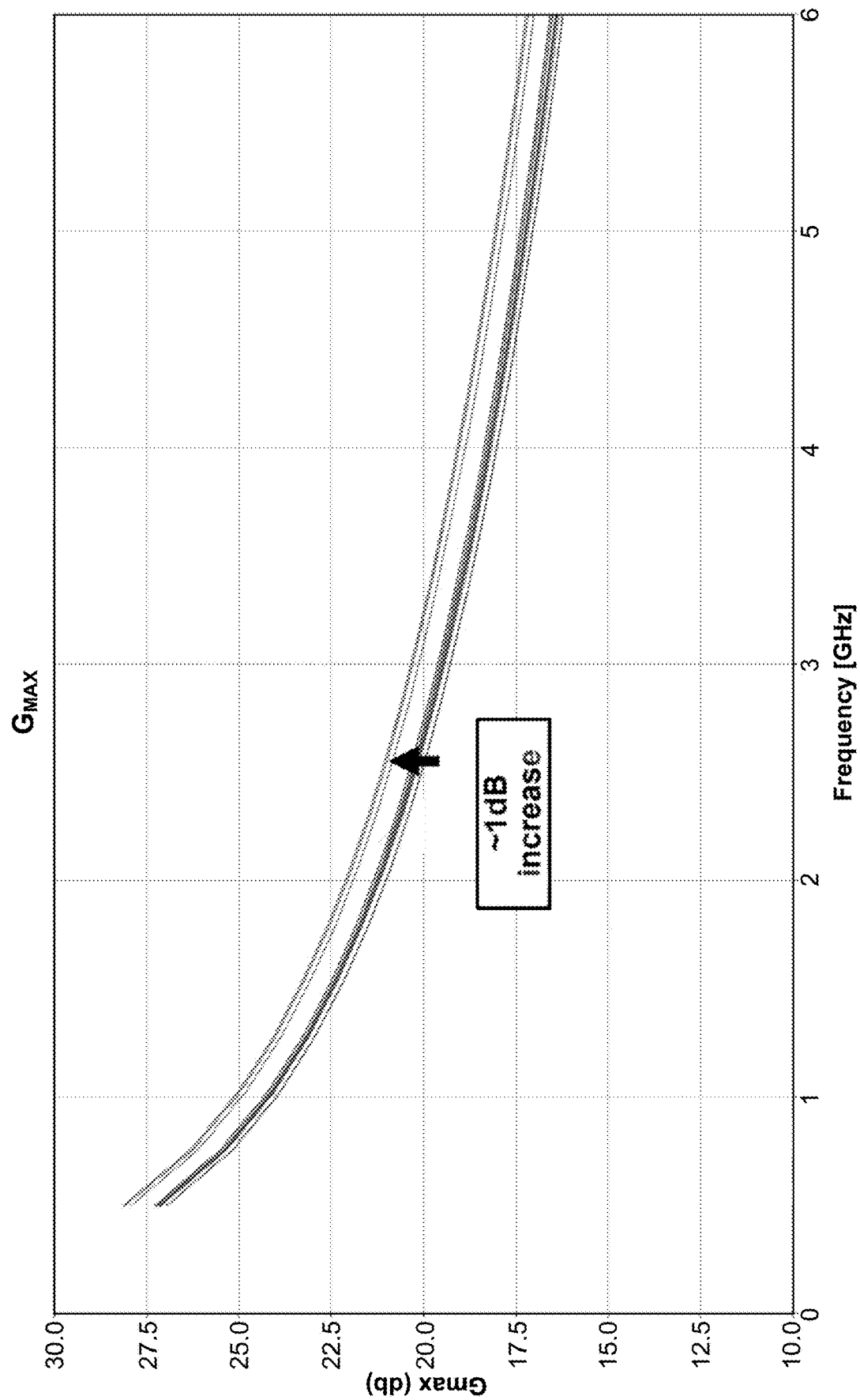

FIGS. 17-20 are charts illustrating measurement results of the field effect transistor 100 in accordance with various embodiments of the present disclosure. Specifically, FIG. 17 is a chart showing an approximate 1.5 dB improvement in Sit magnitude relative to frequency. FIG. 18 includes a chart showing an approximate twenty percent reduction in parasitic capacitance $C_{GD}$ in pF relative to frequency. FIG. 19 includes a chart showing an approximate eight percent reduction in parasitic capacitance $C_{DS}$ in pF relative to frequency. FIG. 20 includes a chart showing an approximate one dB increase in maximum gain ($G_{max}$) relative to frequency.

FIG. 21 shows a die having a transistor with a plurality of fingers of the conventional field effect transistor 10, whereas FIG. 22 shows a die having a transistor with a plurality of fingers of the field effect transistor 100 described in accordance with various embodiments of the present disclosure. Specifically, the drain metal 125 being raised from the substrate 105 can be observed, as well as the notched regions 135, the angled gated tabs 155, 160, and the shielding 170 when compared to the die having conventional field effect transistors 10 of FIG. 21.

While some of the embodiments described herein are described with respect to GaN-on-silicon transistors, it is understood that the embodiments described herein can also be applied to GaN-on-silicon-carbide (GaN on SiC) transistors as well as other types of transistors. In any event, the techniques and optimizations described in various embodiments of the present disclosure for power transistor design on GaN will improve fundamental device performance. For instance, the drain metallization being raised and notched will reduce $C_{DS}$, thereby providing efficiency and bandwidth. The use of the wrap-around source field plate will reduce $C_{GS}$, improving gain and bandwidth. The use of the shielding 170 and angled gate tabs 155, 160 will provide a shielded gate manifold to reduce CGD, providing stable gain and stability to the semiconductor device. The gate-drain spacing is modified to optimize RD, providing improvements in gain, power, and efficiency.

The features, structures, or characteristics described above may be combined in one or more embodiments in any suitable manner, and the features discussed in the various embodiments are interchangeable, if possible. In the following description, numerous specific details are provided in order to fully understand the embodiments of the present disclosure. However, a person skilled in the art will appreciate that the technical solution of the present disclosure may be practiced without one or more of the specific details, or other methods, components, materials, and the like may be employed. In other instances, well-known structures, materials, or operations are not shown or described in detail to avoid obscuring aspects of the present disclosure.

Although the relative terms such as "on," "below," "upper," and "lower" are used in the specification to describe the relative relationship of one component to another component, these terms are used in this specification for convenience only, for example, as a direction in an example shown in the drawings. It should be understood that if the device is turned upside down, the "upper" component described above will become a "lower" component. When a structure is "on" another structure, it is possible that the structure is integrally formed on another structure, or that the structure is "directly" disposed on another structure, or that the structure is "indirectly" disposed on the other structure through other structures.

In this specification, the terms such as "a," "an," "the," and "said" are used to indicate the presence of one or more elements and components. The terms "comprise," "include," "have," "contain," and their variants are used to be open ended, and are meant to include additional elements, components, etc., in addition to the listed elements, components, etc. unless otherwise specified in the appended claims. The terms "first," "second," etc. are used only as labels, rather than a limitation for a number of the objects.

The above-described embodiments of the present disclosure are merely possible examples of implementations set forth for a clear understanding of the principles of the disclosure. Many variations and modifications may be made to the above-described embodiment(s) without departing substantially from the spirit and principles of the disclosure. All such modifications and variations are intended to be included herein within the scope of this disclosure and protected by the following claims.

Therefore, the following is claimed:

1. A field effect transistor, comprising:
a first source metal;
a second source metal;
a gate manifold comprising a gate manifold body, a first angled gate tab, and a second angled gate tab; and
a drain metal positioned between the first source metal and the second source metal over a channel of the field effect transistor, wherein the drain metal comprises a drain metal body having a notched region between the first source metal and the second source metal over the channel, the notched region defining a first projecting portion and a second projecting portion of the drain metal body, the first projecting portion and the second projecting portion positioned on respective sides of the notched region.

2. The field effect transistor of claim 1, wherein the notched region is a triangular-shaped notched region.

3. The field effect transistor of claim 1, wherein the notched region is a U-shaped notched region.

4. The field effect transistor of claim 1, further comprising:
a substrate; and
a first drain metal column and a second drain metal column positioned below the drain metal, wherein:
an aperture is defined between the first drain metal column and the second drain metal column over the substrate and below the drain metal.

5. The field effect transistor of claim 1, further comprising:
a first source-connected field plate (SFP), a second source-connected field plate (SFP), a first gate finger, and a second gate finger.

6. The field effect transistor of claim 1, wherein the field effect transistor is a high-electron-mobility transistor (HEMT), a pseudomorphic high-electron mobility transistor (pHEMT), or a metamorphic high-electron mobility transistor (mHEMT).

7. The field effect transistor of claim 1, wherein the field effect transistor is a gallium nitride (GaN)-on-silicon transistor or a GaN-on-silicon-carbide transistor.

8. A field effect transistor, comprising:
a first source metal;
a second source metal;
a gate manifold comprising a gate manifold body, a first angled gate tab extending to a first gate contact region at an end of the first source metal, and a second angled gate tab extending to a second gate contact region at an end of the second source metal; and
a drain metal, a first drain metal contact, and a second drain metal contact, the first drain metal contact and the second drain metal contact being positioned below the drain metal with an aperture between the first drain metal contact and the second drain metal contact below the drain metal, wherein:
the first angled gate tab extends at a first angle from the gate manifold body; and
the second angled gate tab extends at a second angle from the gate manifold body.

9. The field effect transistor of claim 8, wherein:
the first angled gate tab comprises a first region extending from a first corner of the gate manifold body and a second region extending from the first region of the first angled gate tab to the first gate contact region;
the second angled gate tab comprises a first region extending from a second corner of the gate manifold body and a second region extending from the first region of the second angled gate tab to the second gate contact region; and
the first gate contact region and the second gate contact region are positioned wider apart from each other than a width of the drain metal positioned between the first source metal and the second source metal.

10. The field effect transistor of claim 9, wherein:
the second region of the first angled gate tab is positioned parallel to and offset from a first side of the gate manifold body; and
the second region of the second angled gate tab is positioned parallel to and offset from a second side of the gate manifold body.

11. The field effect transistor of claim 8, further comprising:
a first drain metal column and a second drain metal column positioned below the drain metal.

12. The field effect transistor of claim 11, wherein:
the field effect transistor further comprises a substrate; and
the aperture is defined between the first drain metal column and the second drain metal column over the substrate and below the drain metal.

13. The field effect transistor of claim 8, further comprising:
a first source-connected field plate (SFP), a second source-connected field plate (SFP), a first gate finger, and a second gate finger, wherein:
the first source metal and SFP and the second source metal and SFP are each sized and positioned to include an overhang that defines an overhang aperture in which the gate fingers are positioned, respectively.

14. The field effect transistor of claim 8, wherein the field effect transistor is a high-electron-mobility transistor (HEMT), a pseudomorphic high-electron mobility transistor (pHEMT), or a metamorphic high-electron mobility transistor (mHEMT).

15. A field effect transistor, comprising:
a gate manifold, a first source metal, and a second source metal, the gate manifold comprising a gate manifold body, a first angled gate tab, and a second angled gate tab;
a drain metal positioned between the first source metal and the second source metal; and
a shielding having a first end connected to an end of the first source metal and a second end connected to an end of the second source metal, the shielding comprising a depressed region directly contacting a substrate, the depressed region extending along an end of the drain metal and between the end of the drain metal and the first and second angled gate tabs of the gate manifold.

16. The field effect transistor of claim 15, wherein a width of the shielding is between 10 μm and 15 μm.

17. The field effect transistor of claim 15, wherein the shielding comprises a first stepped region, a second stepped region, and the depressed region positioned between the first stepped region and the second stepped region, the depressed region directly contacting the substrate, the first stepped region and the second stepped region being raised from a surface of the substrate.

18. The field effect transistor of claim 17, wherein:
the first angled gate tab extends through a recess defined by the first stepped region of the shielding such that the shielding does not contact the first angled gate tab; and
the second angled gate tab extends through a recess defined by the second stepped region of the shielding such that the shielding does not contact the second angled gate tab.

19. The field effect transistor of claim 15, further comprising:
a substrate; and
a first drain metal column and a second drain metal column positioned below the substrate, wherein:
an aperture is defined between the first drain metal column and the second drain metal column over the substrate and below the drain metal.

20. The field effect transistor of claim 15, further comprising:
a first source-connected field plate (SFP), a second source-connected field plate (SFP), a first gate finger, and a second gate finger, wherein:
the first SFP and the second SFP are each sized and positioned to include an overhang that defines an overhang aperture in which the gate fingers are positioned, respectively.

* * * * *